US012796460B2

(12) United States Patent
Yoshida et al.

(10) Patent No.: US 12,796,460 B2
(45) Date of Patent: Nov. 10, 2026

(54) SEMICONDUCTOR APPARATUS AND VEHICLE

(71) Applicant: FUJI ELECTRIC CO., LTD., Kawasaki (JP)

(72) Inventors: Daiki Yoshida, Kawasaki (JP); Nobuhiro Higashi, Kawasaki (JP); Tsubasa Nakamura, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 900 days.

(21) Appl. No.: 17/994,154

(22) Filed: Nov. 25, 2022

(65) Prior Publication Data

US 2023/0223314 A1 Jul. 13, 2023

(30) Foreign Application Priority Data

Jan. 7, 2022 (JP) ................................ 2022-001926

(51) Int. Cl.
*H10W 40/22* (2026.01)
*H10W 40/60* (2026.01)
(Continued)

(52) U.S. Cl.
CPC ....... *H10W 40/226* (2026.01); *H10W 76/161* (2026.01)

(58) Field of Classification Search
CPC . H01L 23/3672; H01L 23/041; H01L 23/473; H01L 23/10; H01L 25/072;
(Continued)

(56) References Cited

U.S. PATENT DOCUMENTS 7,643,297 B2 * 1/2010 Tominaga ............ B62D 5/0406 165/80.2
8,093,619 B2 * 1/2012 Hayashi ............. H10H 20/8506 438/26
(Continued)

FOREIGN PATENT DOCUMENTS

JP S62007145 A 1/1987
JP 2005354118 A * 12/2005
(Continued)

*Primary Examiner* — Dale E Page
*Assistant Examiner* — Cristian A Tivarus
(74) *Attorney, Agent, or Firm* — Rabin & Berdo, P.C.

(57) ABSTRACT

A semiconductor apparatus a semiconductor module including a semiconductor device and a resin section covering the periphery of the semiconductor device, and a cooler arranged below the semiconductor device. The cooler includes a top plate that is attached to a lower surface of the resin section. The resin section has a protrusion protruding downward from an outer peripheral edge of the lower surface of the resin section. The protrusion includes a first straight section extending in a predetermined direction in a plan view of the semiconductor apparatus, and a first curved section having a curved shape convex inward the semiconductor module and being connected to the first straight section. The top plate includes a first notch that is engageable with the protrusion, and the resin section and the top plate are bonded to each other with an adhesive interposed therebetween.

20 Claims, 17 Drawing Sheets

(51) Int. Cl.
*H10W 76/12* (2026.01)
*H10W 90/00* (2026.01)

(58) Field of Classification Search
CPC ............. H01L 23/3735; H01L 23/3121; H01L 23/367; H01L 23/40; H02M 7/003; B60R 16/02; H10W 76/161; H10W 90/00; H10W 40/22; H10W 40/60; H10W 74/114
See application file for complete search history.

(56) References Cited

U.S. PATENT DOCUMENTS

| | | | | |
|---|---|---|---|---|
| 10,214,109 | B2 * | 2/2019 | Gohara | H05K 7/20927 |
| 2008/0158823 | A1 * | 7/2008 | Tominaga | B60R 16/0239 361/709 |
| 2011/0298121 | A1 * | 12/2011 | Nishibori | H01L 23/24 257/784 |
| 2019/0363036 | A1 * | 11/2019 | Arai | H05K 7/20927 |

FOREIGN PATENT DOCUMENTS

| | | | | | |
|---|---|---|---|---|---|
| JP | 2009158586 | A | * | 7/2009 | H05K 3/3405 |
| JP | 2010114257 | A | * | 5/2010 | |
| JP | 2014123659 | A | | 7/2014 | |
| JP | 2016051878 | A | | 4/2016 | |

* cited by examiner

SEMICONDUCTOR APPARATUS AND VEHICLE

CROSS REFERENCE TO RELATED APPLICATIONS

This application is based upon and claims the benefit of priority of the prior Japanese Patent Application No. 2022-001926, filed on Jan. 7, 2022, the entire contents of which are incorporated herein by reference.

BACKGROUND OF THE INVENTION

Field of the Invention

The present invention relates to a semiconductor apparatus and a vehicle.

Description of the Related Art

A semiconductor module includes a substrate provided with a semiconductor device such as an IGBT (insulated gate bipolar transistor), a power MOSFET (metal oxide semiconductor field effect transistor), or an FWD (free wheeling diode), and is used for an inverter apparatus or the like.

In this type of semiconductor apparatus, a semiconductor device is arranged on an insulating substrate (that may be referred to as a laminate substrate), and a metal wiring board for wiring (that may be referred to as a terminal connection section, a lead frame, or an external electrode) is arranged on an upper electrode of the semiconductor device in Japanese Patent Laid-Open Nos. 62-7145, 2014-123659, 2005-354118, 2016-51878, and 2010-114257 for example. The semiconductor device is surrounded by a case, and a cooler (e.g., a heat sink) is attached to a lower surface of the case.

Specifically, in Japanese Patent Laid-Open No. 62-7145, a bottom portion of an outer frame of the apparatus is provided with a protrusion, and the protrusion is inserted into a through hole of a heat dissipation fin. In Japanese Patent Laid-Open No. 2014-123659, a bottom portion of a frame body is provided with a protrusion, and the protrusion is inserted into an insertion hole formed on an arrangement surface of a heat sink. In Japanese Patent Laid-Open No. 2005-354118, a bottom portion of a frame member is provided with a locking section having a convex shape, and the locking section engages with an engagement section of a circuit board.

To combine a case constituting a part of a semiconductor module and a cooler, alignment is required. For example, a configuration in which a protrusion for positioning is provided on the case side, a hole or a notch for engagement is provided on the cooler side, and the protrusion and the hole or the notch are fitted to each other to implement positioning therebetween is disclosed, as described above.

However, the protrusion on the case side and the hole or the notch on the cooler side often assume engagement of their respective metal materials. In this case, when the metal materials are rubbed against each other, metal powder can be generated. To prevent this, a clearance between members may be sufficiently ensured. However, this is not so preferable from the viewpoint of a positioning accuracy.

The present invention has been made in view of such points, and one of its objects is to provide a semiconductor apparatus capable of improving a positioning accuracy between a case and a cooler while preventing metal powder from being generated, and a vehicle.

SUMMARY OF THE INVENTION

A semiconductor apparatus according to an aspect of the present invention includes a resin section covering the periphery of a semiconductor device, and a cooler arranged below the semiconductor device, in which the cooler has a top plate attached to a lower surface of the resin section, the resin section has a protrusion protruding downward from a lower surface of its outer peripheral edge, the protrusion includes a first straight section extending in a predetermined direction in a planar view, and a first curved section connected to the first straight section and curved to be convex in a direction away from the first straight section, the top plate includes a notch that can engage with the protrusion, and the resin section and the top plate are bonded to each other with an adhesive interposed therebetween.

According to the present invention, it is possible to improve a positioning accuracy between a case and a cooler while preventing metal powder from being generated.

BRIEF DESCRIPTION OF THE DRAWINGS

FIG. 3 is a partially enlarged view in which one phase illustrated in FIG. 2 is paid attention to;

DETAILED DESCRIPTION OF THE PREFERRED EMBODIMENT

Figure 1:
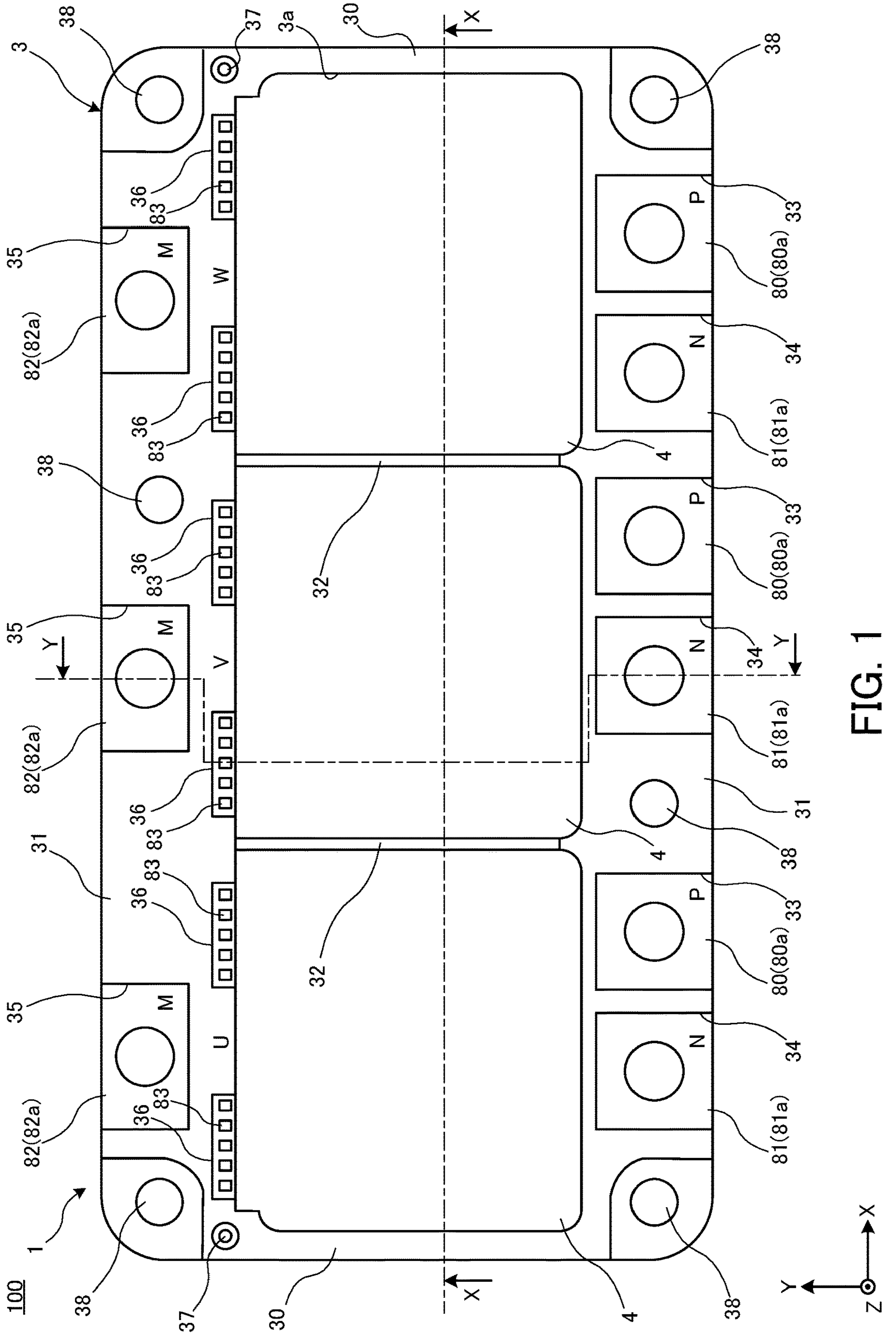
FIG. 1 is a plan view illustrating a semiconductor apparatus according to the present embodiment as viewed from above.
Figure 2:
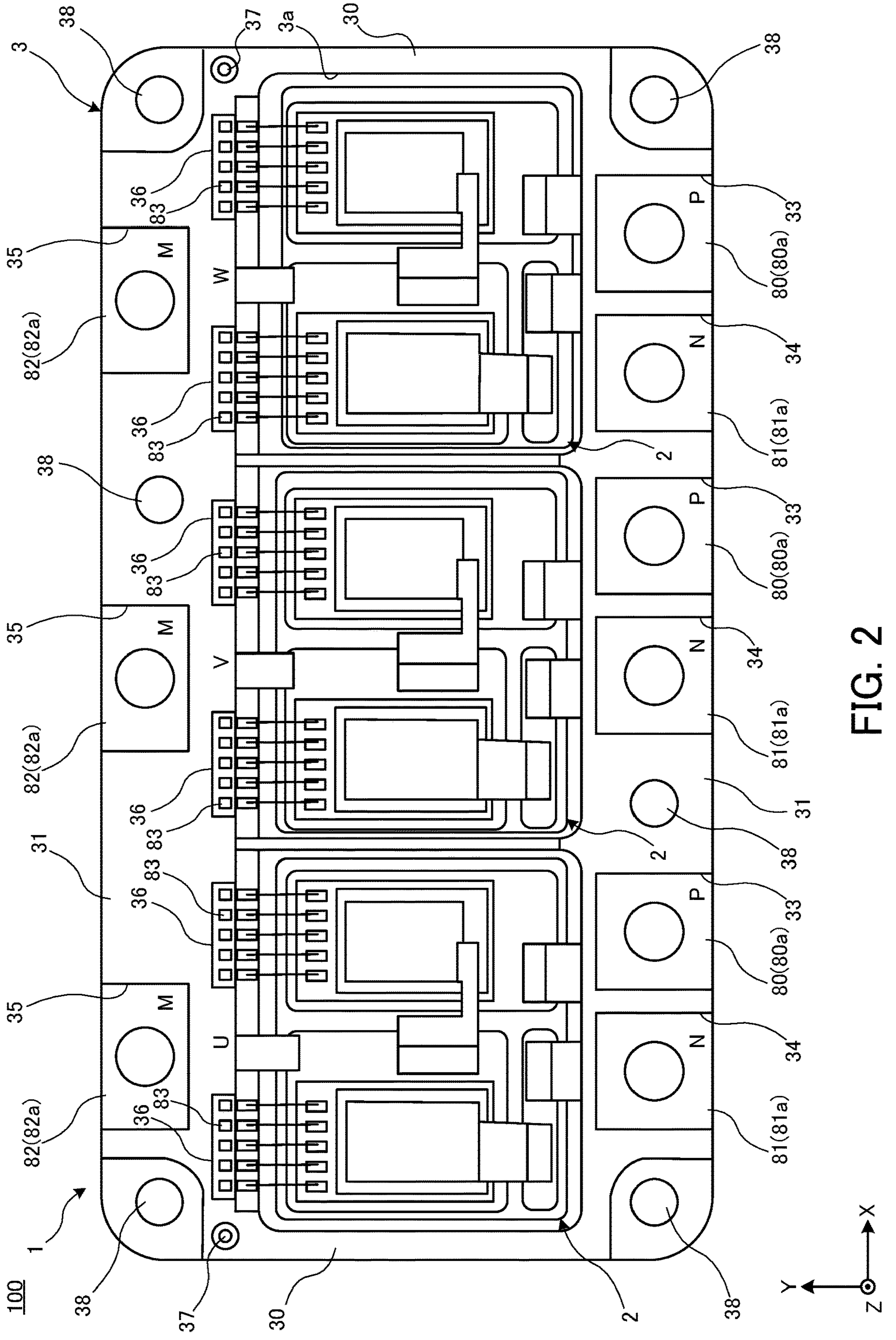
FIG. 2 is a plan view in which sealing resin illustrated in FIG. 1 is omitted.
Figure 3:
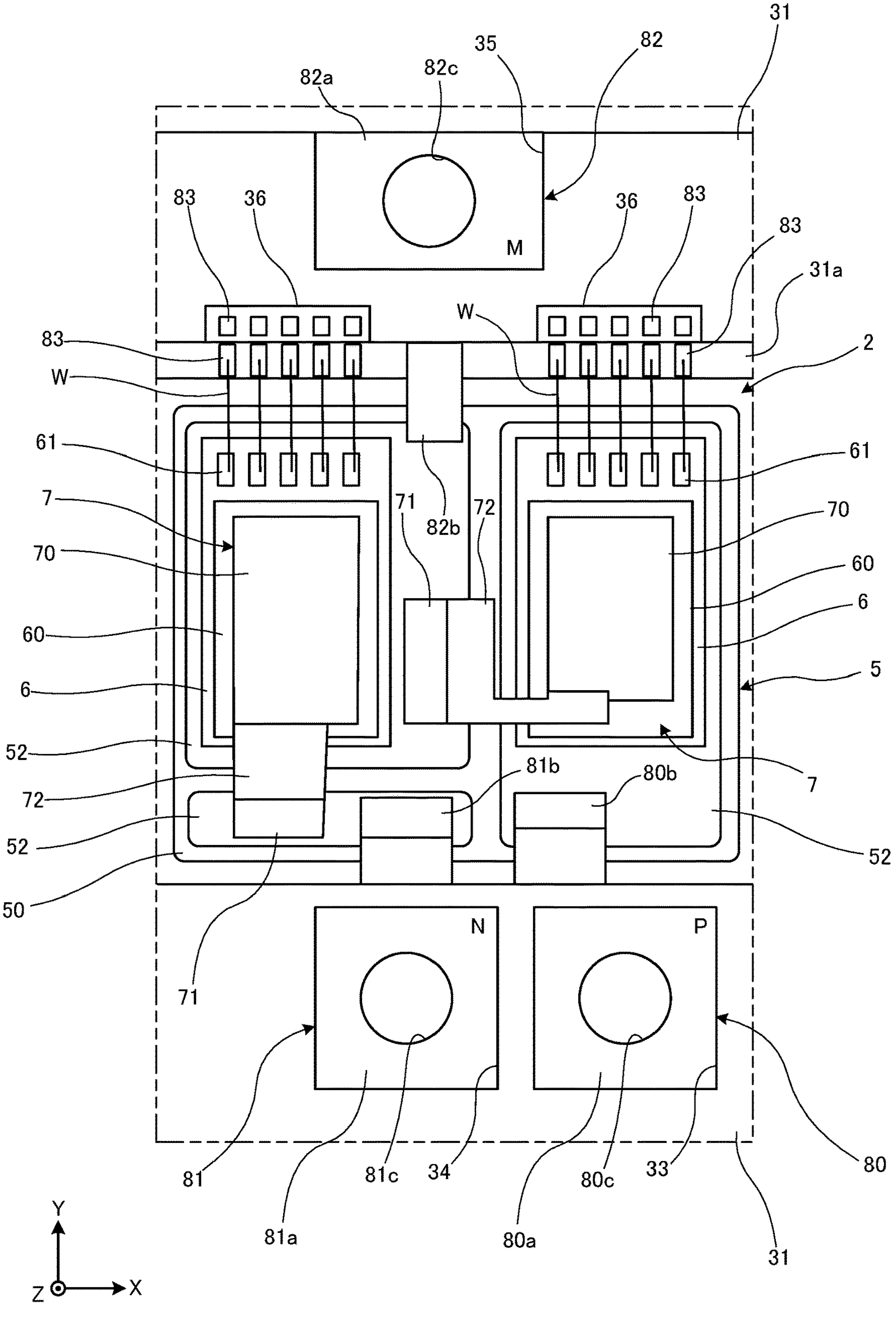
Figure 4:
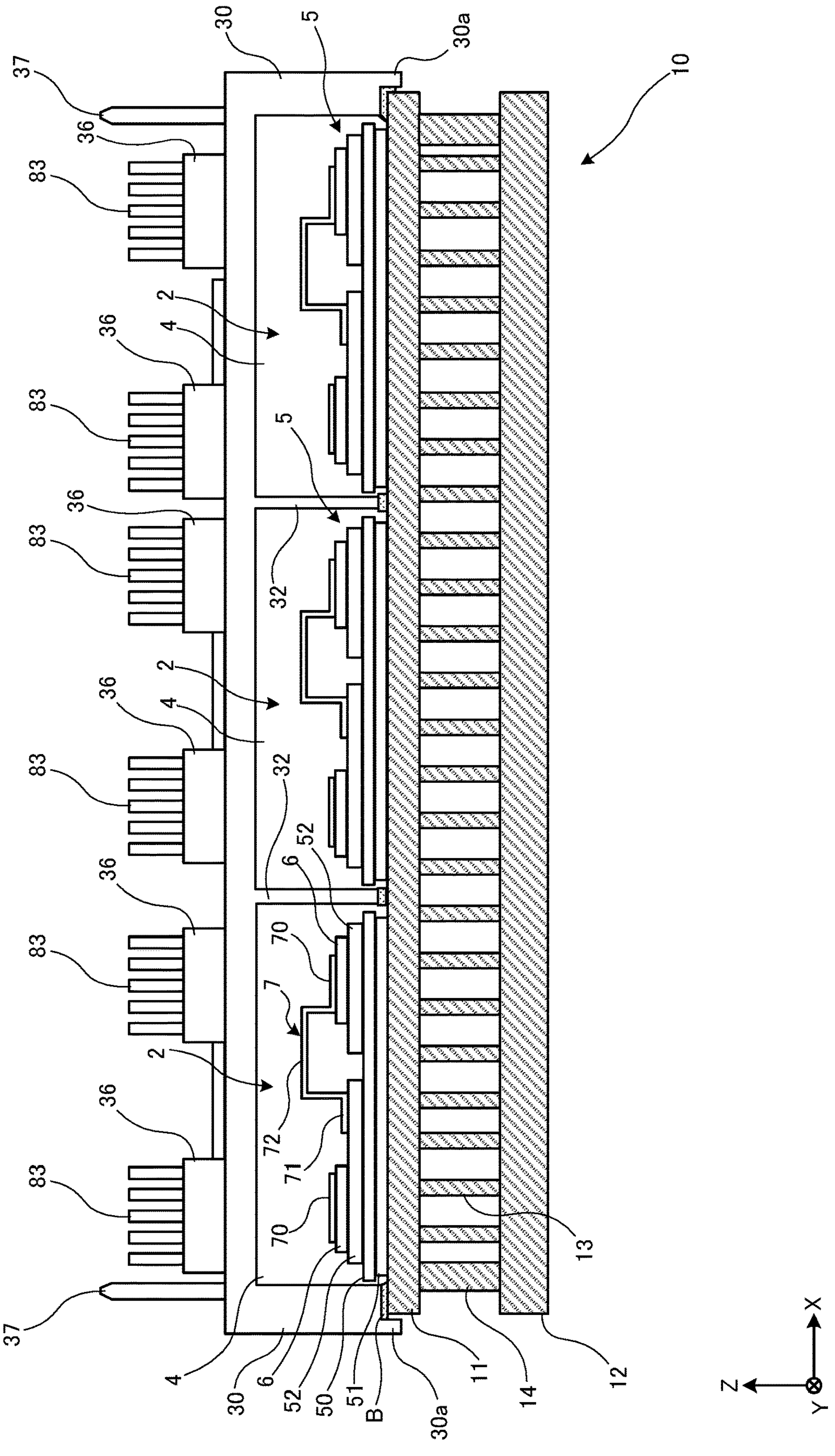
FIG. 4 is a cross-sectional view taken along a line X-X of the semiconductor apparatus illustrated in FIG. 1.
Figure 5:
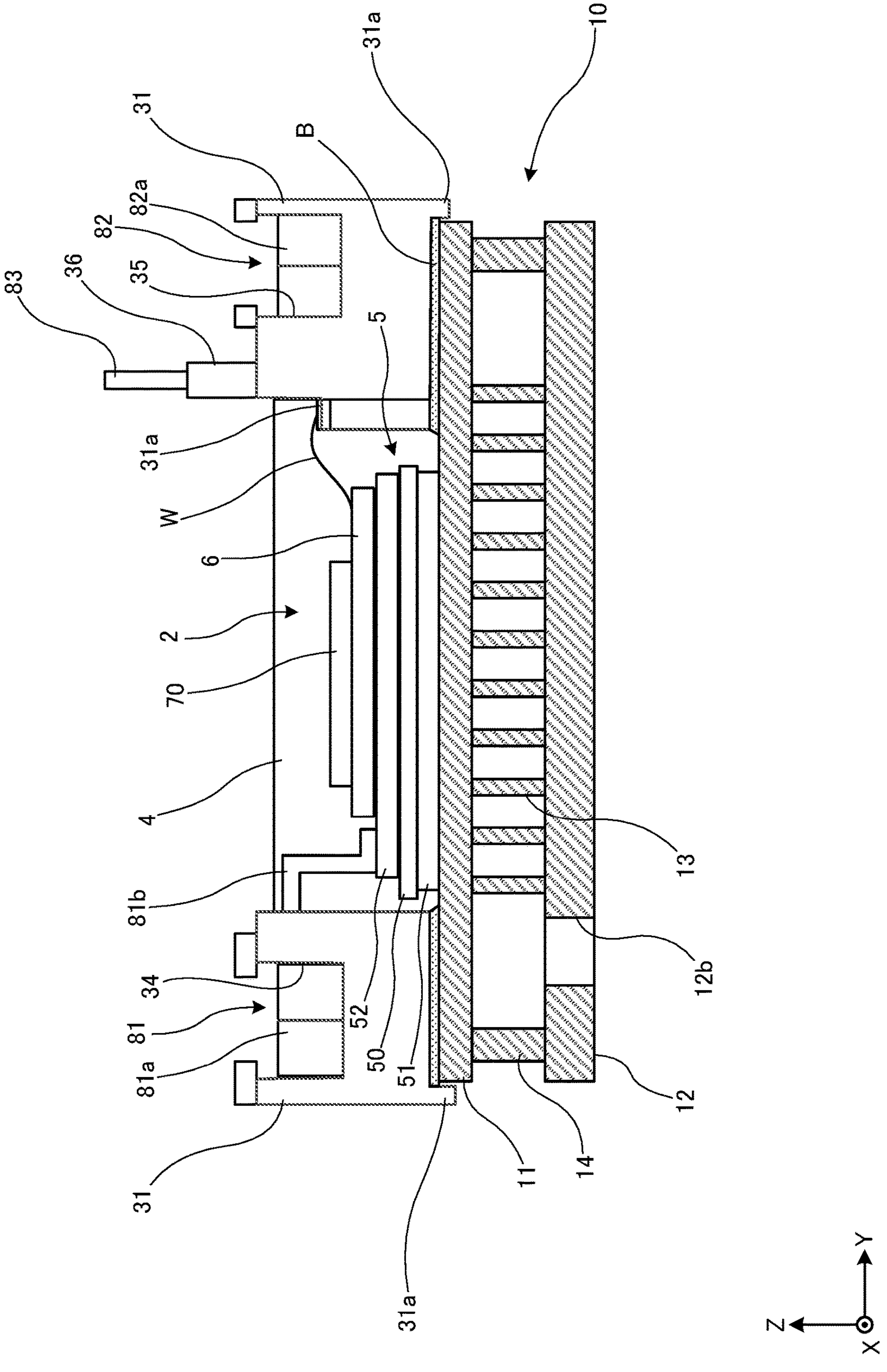
FIG. 5 is a cross-sectional view taken along a line Y-Y of the semiconductor apparatus illustrated in FIG. 1.
Figure 6:
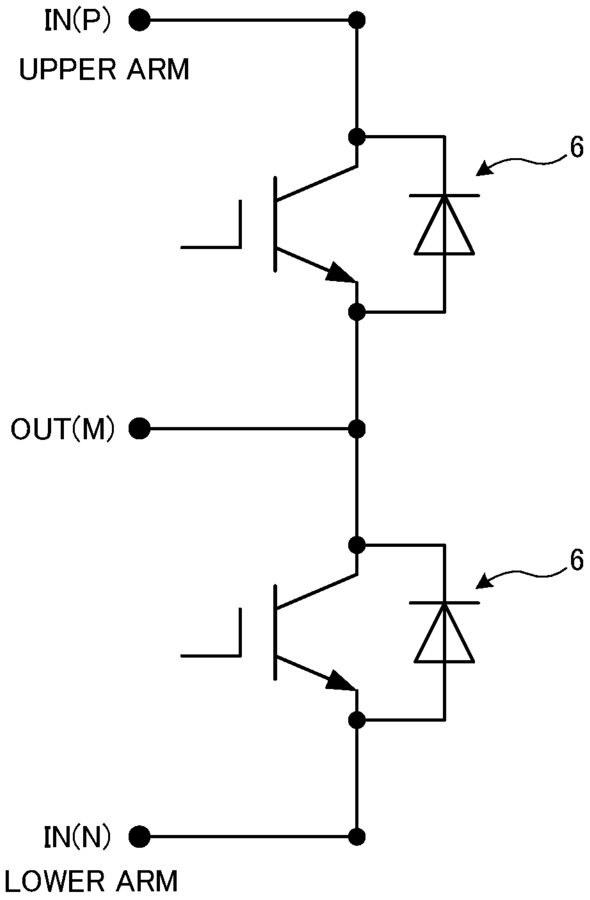
FIG. 6 is an equivalent circuit diagram of the semiconductor apparatus according to the present embodiment.

A semiconductor apparatus to which the present invention is applicable will be described below. FIG. 1 is a plan view illustrating a semiconductor apparatus according to the present embodiment as viewed from above. FIG. 2 is a plan view in which sealing resin illustrated in FIG. 1 is omitted. FIG. 3 is a partially enlarged view in which one phase illustrated in FIG. 2 is paid attention to. FIG. 4 is a cross-sectional view taken along a line X-X of the semiconductor apparatus illustrated in FIG. 1. FIG. 5 is a cross-sectional view taken along a line Y-Y of the semiconductor apparatus illustrated in FIG. 1. FIG. 6 is an equivalent circuit diagram of the semiconductor apparatus according to the present embodiment.

In the following drawings, a longitudinal direction of a semiconductor module (a cooler or a metal wiring board), a direction perpendicular to the longitudinal direction of the semiconductor module (the cooler or the metal wiring board), and a height direction (a thickness direction of a substrate) are respectively defined as an X-direction, a Y-direction, and a Z-direction. The longitudinal direction of the semiconductor module represents a direction in which a plurality of wiring boards are arranged. X-, Y-, and Z-axes as illustrated are perpendicular to one another, to constitute a right-handed system. In some cases, the X-direction, the Y-direction, and the Z-direction may be respectively referred to as a left-right direction, a front-rear direction, and an up-down direction. Further, a +Z-direction and a −Z-direction may be respectively referred to as an upward direction and a downward direction. A position on the +Z-side and a position on the −Z-side may be respectively referred to as a high position and a low position. The directions (front-rear, left-right, and up-down directions) and terms "high" and "low" are used for convenience of illustration, and a correspondence with each of the X-, Y-, and Z-directions may change depending on an attachment posture of the semiconductor module. For example, the heat dissipation surface side (cooler side) of the semiconductor module and the opposite side thereof may be respectively referred to as the lower surface side and the upper surface side. In this specification, a planar view means a case where an upper surface or a lower surface of the semiconductor module is viewed in the Z-direction. Respective aspect ratios and magnitude relationships among members in the drawings do not necessarily match one another because they are represented with schematic views. For convenience of illustration, a case where the magnitude relationship among the members is exaggerated is also assumed.

A semiconductor apparatus 100 according to the present embodiment is applied to a power conversion apparatus such as an inverter of an industrial or in-vehicle motor, for example. As illustrated in FIGS. 1 to 5, the semiconductor apparatus 100 is configured by arranging a semiconductor module 1 on an upper surface of a cooler 10. In contrast with the semiconductor module 1, the cooler 10 has any configuration.

The cooler 10 dissipates heat of the semiconductor module 1 to the exterior, and has a rectangular shape in a planar view. A detailed configuration of the cooler 10 will be described below.

The semiconductor module 1 includes a plurality of (three in the present embodiment) semiconductor units 2, a case 3 that houses the plurality of semiconductor units 2, and sealing resin 4 to be injected into the case 3.

The semiconductor unit 2 includes a laminate substrate 5 and a semiconductor device 6 arranged on the laminate substrate 5. In the present embodiment, the three semiconductor units 2 are arranged side by side in the X-direction. The three semiconductor units 2 constitute a U phase, a V phase, and a W phase from the positive side in the X-direction, for example, and form a three-phase inverter circuit as a whole. The semiconductor unit 2 may be referred to as a power cell.

The laminate substrate 5 is composed of a DCB (direct copper bonding) substrate, an AMB (active metal brazing) substrate, or a metal base substrate, for example. The laminate substrate 5 is configured by laminating an insulating plate 50, a heat dissipation plate 51, and a plurality of wiring boards 52, and is formed into a rectangular shape in a planar view as a whole.

Specifically, the insulating plate 50 is formed of a plate-shaped body having an upper surface and a lower surface, and has a rectangular shape in a planar view extending in the X-direction. The insulating plate 50 may be formed of a ceramic material such as aluminum oxide ($Al_2O_3$), aluminum nitride (AlN), silicon nitride ($Si_3N_4$), or aluminum oxide ($Al_2O_3$) and zirconium oxide ($ZrO_2$).

The insulating plate 50 may be formed of thermosetting resin such as epoxy resin or polyimide resin or a composite material of thermosetting resin and glass or a ceramic material used as a filler. The insulating plate 50 may be preferably formed of a material having flexibility, for example, containing thermosetting resin. The insulating plate 50 may be referred to as an insulating layer or an insulating film.

The heat dissipation plate 51 has a predetermined thickness in the Z-direction, and has a rectangular shape in a planar view extending in the Y-direction. The heat dissipation plate 51 is formed of a metal plate having good thermal conductivity such as copper or aluminum. The heat dissipation plate 51 is arranged on a lower surface of the insulating plate 50. A lower surface of the heat dissipation plate 51 is a surface to be attached to the cooler 10 as an attachment destination of the semiconductor module 1, and also functions as a heat dissipation surface (heat dissipation region) for dissipating heat of the semiconductor module 1. The heat dissipation plate 51 is bonded to an upper surface of the cooler 10 via a bonding material (not illustrated) such as a solder. The heat dissipation plate 51 may be arranged on the upper surface of the cooler 10 via a thermally conductive material such as a thermal grease or a thermal compound.

The plurality of (three in the present embodiment) wiring boards 52 respectively have predetermined thicknesses, and are respectively formed into island shapes electrically independent of one another (e.g., rectangular shapes in a planar view). The three wiring boards 52 are arranged on an upper surface of the insulating plate 50. Respective shapes, numbers of arrangements, and arrangement portions, for example, of the wiring boards 52 are not limited to these, but are appropriately changeable. The wiring boards 52 may be each formed of a metal plate having good thermal conductivity such as copper or aluminum. The wiring boards 52 may be each referred to as a circuit layer or a circuit pattern.

The semiconductor devices 6 are each arranged via a bonding material (not illustrated) such as a solder on an upper surface of the predetermined circuit board 52. The bonding material may be a material having conductivity, for example, a solder or a metallic sintered material. The semiconductor device 6 is formed into a rectangular shape in a planar view of a semiconductor substrate made of silicon (Si), for example.

The semiconductor device 6 may be composed of a wide bandgap semiconductor device (that may be referred to as a wide gap semiconductor device) formed of a wide bandgap semiconductor substrate made of silicon carbide (SiC), gallium nitride (GaN), diamond, or the like in addition to silicon, described above.

A switching element such as an IGBT (insulated gate bipolar transistor) or a power MOSFET (metal oxide semiconductor field effect transistor), or a diode such as an FWD (free wheeling diode) may be used for the semiconductor device 6.

Figure 9:
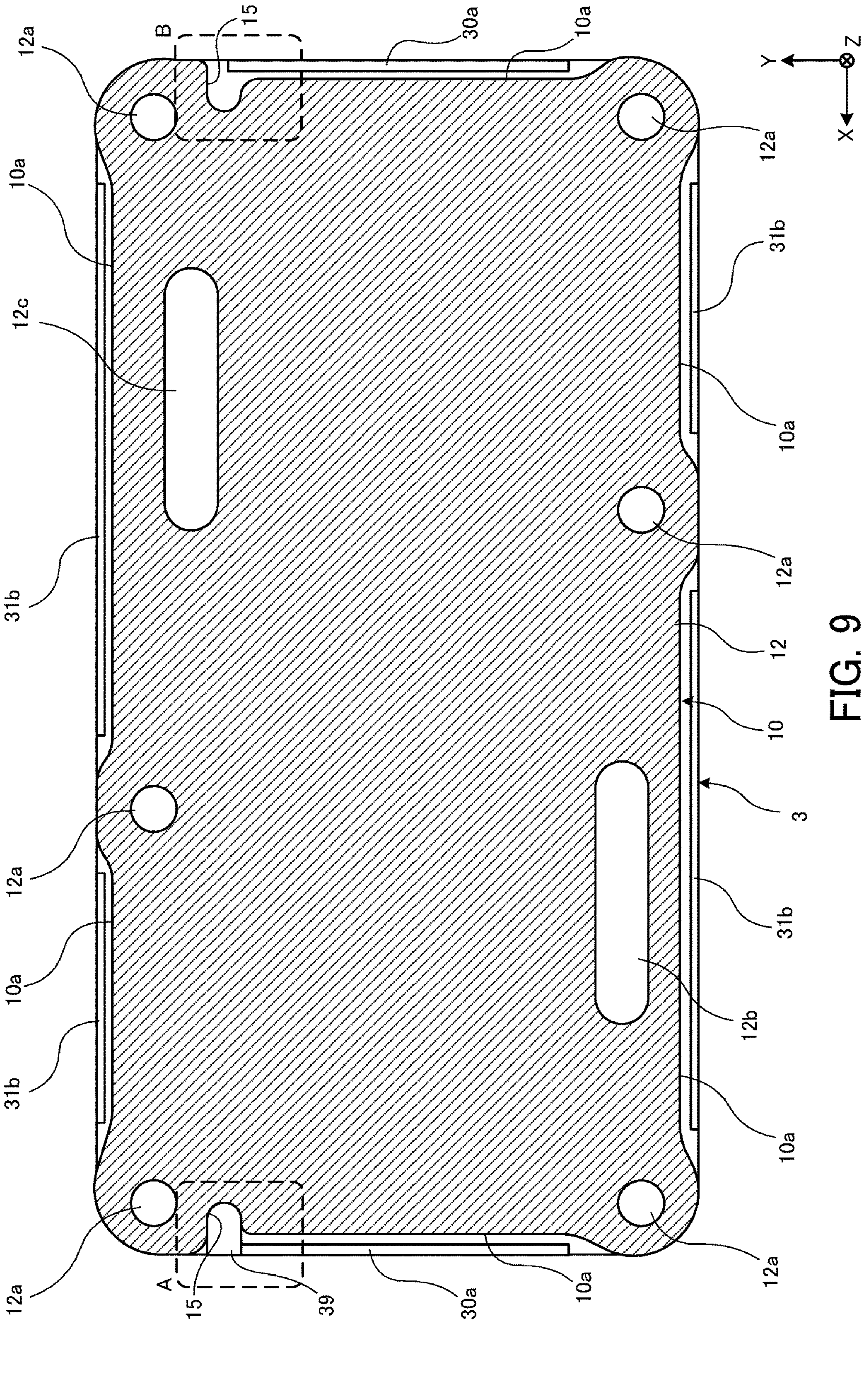
FIG. 9 is a rear view of the semiconductor apparatus according to the present embodiment.

In the present embodiment, the semiconductor device 6 may be composed of an RC (reverse conducting)-IGBT element obtained by integrating respective functions of an IGBT (insulated gate bipolar transistor) element and an FWD (free wheeling diode) element (see, e.g., FIG. 9).

The semiconductor device 6 is not limited to this, but may be configured by combining a switching element, a diode, and the like, described above. For example, the IGBT element and the FWD element may be separately configured. An RB (reverse blocking)-IGBT or the like sufficiently resistant to a reverse bias may be used as the semiconductor device 6.

A shape, a number of arrangements, and an arrangement portion, for example, of the semiconductor device 6 are appropriately changeable. For example, in the present embodiment, two semiconductor devices 6 are arranged per phase. As illustrated in FIG. 6, one of the two semiconductor devices 6 may constitute an upper arm, and the other semiconductor device 6 may constitute a lower arm.

The semiconductor device 6 to be thus configured has an upper surface and a lower surface on its XY surface, and electrodes are respectively formed on the upper surface and the lower surface. For example, a main electrode 60 and a control electrode 61 are formed on the upper surface of the semiconductor device 6, and a main electrode (not illustrated) is also formed on the lower surface of the semiconductor device 6. The main electrode 60 on the upper surface and the main electrode on the lower surface are each an electrode through which a main current flows, and are each formed into a rectangular shape in a planar view having an area representing a large part of the upper surface of the semiconductor device 6. On the other hand, the control electrode 61 is formed into a rectangular shape in a planar view sufficiently smaller than the main electrode 60. For example, in the present embodiment, a plurality of (five) control electrodes 61 are arranged side by side offset toward one side of the semiconductor device 6. An arrangement of the electrodes is not limited to this, but is appropriately changeable.

If the semiconductor device 6 is a MOSFET element, for example, the main electrode on the upper surface side may be referred to as a source electrode, and the main electrode on the lower surface side may be referred to as a drain electrode. If the semiconductor device 6 is an IGBT element, the main electrode on the upper surface side may be referred to as an emitter electrode, and the main electrode on the lower surface side may be referred to as a collector electrode.

The control electrode 61 may include a gate electrode. The gate electrode is an electrode that controls a gate for turning on and off a main current. The control electrode 61 may include an auxiliary electrode. For example, an auxiliary electrode may be an auxiliary source electrode or an auxiliary emitter electrode to be electrically connected to a main electrode on the upper surface side and serving as a reference potential for a gate potential. The auxiliary electrode may be a temperature sense electrode that measures the temperature of a semiconductor device. The electrodes (the main electrode 60 and the control electrode 61) formed on the upper surface of the semiconductor device 6 may be collectively referred to as an upper surface electrode, and the electrode formed on the lower surface of the semiconductor device 6 may be referred to as a lower surface electrode.

The semiconductor device 6 in the present embodiment may be a so-called vertical switching element obtained by forming functional elements such as a transistor in the thickness direction on a semiconductor substrate, or may be a horizontal switching element obtained by forming the functional elements in a planar direction.

The upper surface (the main electrode 60) of the semiconductor device 6 and an upper surface of the other wiring board 52 are electrically connected to each other by the metal wiring board 7. The metal wiring board 7 constitutes a main current wiring member, and functions as a part of a path of a main current flowing in the semiconductor module 1 (a main current path).

The metal wiring board 7 is composed of a plate-shaped body having an upper surface and a lower surface. The metal wiring board 7 is formed of a metal such as copper, a copper alloy, an aluminum alloy, or an iron alloy. The metal wiring board 7 is formed into a predetermined shape by press working, for example. A shape of the metal wiring board 7 described below merely represents an example, and is appropriately changeable. The metal wiring board 7 may be referred to as a lead frame.

The metal wiring board 7 according to the present embodiment has a crank shape that has been bent a plurality of times in a side view. Specifically, the metal wiring board 7 includes a first bonding section 70, a second bonding section 71, and a connection section 72. The first bonding section 70 is bonded to the upper surface of the semiconductor device 6 via a bonding material (not illustrated). The second bonding section 71 is bonded to the upper surface of the other wiring board 52 via a bonding material (not illustrated). The bonding material may be a material having conductivity, for example, a solder or a metallic sintered material. The connection section 72 connects the first bonding section 70 and the second bonding section 71 to each other.

A shape, a number of arrangements, and an arrangement portion, for example, of the above-described metal wiring board 7 are merely examples, and are not limited to these, but are appropriately changeable. In the present embodiment, an inverter circuit illustrated in FIG. 6, for example, may be formed of the semiconductor device 6 and the metal wiring board 7, described above, a main terminal, described below, and the like, details of which will be described below.

The laminate substrate 5, the semiconductor device 6, and the metal wiring board 7 are surrounded by the case 3. The case 3 has a cylindrical shape or a frame shape having a square annular shape in a planar view, and is formed of thermoplastic resin, for example. Examples of the thermoplastic resin include polyphenylene sulfide (PPS) resin, polybutylene terephthalate (PBT) resin, polybutylene succinate (PBS) resin, polyamide (PA) resin, polyether ether ketone (PEEK) resin, and acrylonitrile-butadiene-styrene (ABS) resin. An inorganic filler for improving strength and/or functionality may be mixed into the resin. The case 3 is formed by injection molding using such thermoplastic resin. The case 3 may be referred to as a resin case or a resin section.

An internal space defined by the case 3 is filled with the sealing resin 4. The internal space may be filled with the sealing resin 4 such that an upper surface of the sealing resin 4 reaches the upper end of the case 3. As a result, various types of components (three semiconductor units 2 (laminate substrates 5 and semiconductor devices 6), the metal wiring board 7, and a wiring member W, etc.) arranged in the case 3 are sealed.

The sealing resin 4 may be composed of thermosetting resin, for example. The sealing resin 4 preferably includes at least one of epoxy resin, silicone resin, phenol resin, and melamine resin. Epoxy resin in which an inorganic filler is mixed, for example, is preferable for the sealing resin 4 in terms of insulation, heat resistance, and heat dissipation.

The case 3 is formed into a rectangular frame shape having an opening section 3*a* at its center. More specifically, the case 3 includes a pair of side walls 30 opposing each other in the X-direction and a pair of side walls 31 opposing each other in the Y-direction, and is formed into a rectangular frame shape by connecting respective end portions of the pairs to each other. The pair of side walls 31 is longer than the pair of side walls 30.

The paired side walls 31 are connected to each other by two partition walls 32 extending in the Y-direction. As a result, the internal space defined by the case 3 is partitioned into three spaces arranged side by side in the X-direction. The semiconductor unit 2 and the metal wiring board 7 are housed in each of the spaces. That is, the three semiconductor units 2 and the metal wiring board 7 are housed in a space defined by the frame-shaped case 3. A lower end of the case 3 is bonded to an upper surface of the cooler 10 (a top plate 11, described below) with an adhesive B interposed therebetween. The adhesive B is preferably an epoxy-based adhesive or a silicone-based adhesive, for example. A detailed structure of the case 3 will be described below.

The case 3 is provided with main terminals for external connection (a P terminal 80, an N terminal 81, an M terminal 82) and control terminals 83 for control. Recesses 33 and 34 each having a square shape in a planar view are formed on the side wall 31 positioned on the negative side in the Y-direction out of the paired side walls 31 opposing each other in the direction perpendicular to the longitudinal direction of the case 3 (the Y-direction).

The P terminal 80 (a nut section 80*a*, described below) is arranged in the recess 33. One P terminal 80 is arranged per phase. An end portion of the P terminal 80 (a distal end of a plate-shaped section 80*b*, described below) is connected to the predetermined wiring board 52 via a bonding material such as a solder.

The P terminal 80 is formed by integrally molding or connecting the nut section 80*a* and the plate-shaped section 80*b*. The nut section 80*a* is formed of a square nut having a predetermined thickness. The nut section 80*a* has a screw hole 80*c* penetrating therethrough formed in the thickness direction at its center. The nut section 80*a* is provided on the one end (proximal end) side of the plate-shaped section 80*b*.

The plate-shaped section 80*b* has a flat plate shape having an upper surface and a lower surface. The plate-shaped section 80*b* has an elongated shape extending in the Y-direction in a planar view. The other end (distal end) of the plate-shaped section 80*b* is bonded to the predetermined wiring board 52 via a bonding material (not illustrated).

Similarly, the N terminal 81 (a nut section 81*a*, described below) is arranged in the recess 34. One N terminal 81 is arranged per phase. An end portion of the N terminal 81 (a distal end of a plate-shaped section 81*b*) is connected to the predetermined wiring board 52 via a bonding material such as a solder.

The N terminal 81 is formed by integrally molding or connecting the nut section 81*a* and the plate-shaped section 81*b*. The nut section 81*a* is formed of a square nut having a predetermined thickness. The nut section 81*a* has a screw hole 81*c* penetrating therethrough formed in the thickness direction at its center. The nut section 81*a* is provided on the one end (proximal end) side of the plate-shaped section 81*b*.

The plate-shaped section 81*b* has a flat plate shape having an upper surface and a lower surface. The plate-shaped section 81*b* has an elongated shape extending in the Y-direction in a planar view. The other end (distal end) of the plate-shaped section 81*b* is bonded to the predetermined wiring board 52 via a bonding material (not illustrated).

A recess 35 having a square shape in a planar view is formed on the side wall 31 on the positive side in the Y-direction out of the paired side walls 31 opposing each other in the direction perpendicular to the longitudinal direction of the case 3 (the Y-direction). The M terminal 82 (a nut section 82*a*, described below) is arranged in the recess 35. One M terminal 82 is arranged per phase. An end portion of the M terminal 82 (a distal end of a plate-shaped section 82*b*) is connected to the predetermined wiring board 52 via a bonding material such as a solder.

The M terminal 82 is formed by integrally molding or connecting the nut section 82*a* and the plate-shaped section 82*b*. The nut section 82*a* is formed of a square nut having a predetermined thickness. The nut section 82*a* has a screw hole 82*c* penetrating therethrough formed in the thickness direction at its center. The nut section 82*a* is provided on the one end (proximal end) side of the plate-shaped section 82*b*.

The plate-shaped section 82*b* has a flat plate shape having an upper surface and a lower surface. The plate-shaped section 82*b* has an elongated shape extending in the Y-direction in a planar view. The other end (distal end) of the plate-shaped section 82*b* is bonded to the predetermined wiring board 52 via a bonding material (not illustrated).

The above-described P terminal 80, N terminal 81, and M terminal 82 may be respectively referred to as a positive electrode terminal (input terminal), a negative electrode terminal (output terminal), and an intermediate terminal (output terminal). The terminals respectively constitute metal wiring boards through which a main current flows. Respective one ends of the P terminal 80, the N terminal 81, and the M terminal 82 constitute main terminals that can be connected to an external conductor. As described above, the respective one ends of the P terminal 80, the N terminal 81, and the M terminal 82 are respectively bonded to the predetermined wiring boards 52 via a bonding material (not illustrated). The P terminal 80, the N terminal 81, and the M terminal 82 respectively correspond to P, N, and M illustrated in FIG. 6.

The main terminals are each formed of a metal material such as a copper material, a copper alloy-based material, an aluminum alloy-based material, or an iron alloy-based material. Respective shapes, arrangement portions, and numbers of arrangements, for example, of the terminals are not limited to the foregoing, but are appropriately changeable.

A pair of pillar sections 36 vertically protruding in the Z-direction is formed on an upper surface of the side wall on the positive side in the Y-direction of the case 3. Each of the pillar sections 36 has an elongated shape extending in the X-direction in a planar view along the opening section 3*a*. Two pillar sections 36 are arranged per phase, and are arranged side by side in the X-direction. A stepped section 31*a* lowered by one step from the upper surface of the side wall 31 is formed along the opening section 3*a* on the inner side (on the negative side in the Y-direction) of the pillar section 36.

A plurality of control terminals 83 are embedded into the pillar sections 36. Five control terminals 83 are embedded into one pillar section 36. One end of each of the control terminals 83 protrudes from an upper surface of the pillar section 36, and extends upward in the Z-direction. The other end of the control terminal 83 protrudes to an upper surface of the stepped section 31*a*. Five control terminals 83 are arranged per semiconductor device 6, and ten control terminals 83 are arranged per phase. The control terminals 83 are respectively provided to correspond to the control electrodes 61. A number of arrangements of the control terminal 83 is not limited to this, but is appropriately changeable.

The control terminals 83 are each formed of a metal material such as a copper material, a copper alloy-based material, an aluminum alloy-based material, or an iron alloy-based metal material. The control terminals 83 are integrally molded (insert-molded) to be embedded into the case 3.

Positioning pins 37 extending in the Z-direction are provided on an upper surface of the side wall 30. The positioning pin 37 is provided adjacent to the negative side in the X-direction of the pillar section 36 on the upper surface of the side wall 30 on the negative side in the X-direction. The positioning pin 37 is also provided adjacent to the positive side in the X-direction of the pillar section 36 on the upper surface on the positive side in the X-direction.

The two positioning pins 37 are each formed of a metal material, for example. The two positioning pins 37 each function as a pin for positioning to be performed when a control substrate not illustrated is attached.

The case 3 has a plurality of through holes 38 formed along its outer peripheral edge. The through holes 38 are each a hole into which a screw (not illustrated) for fixing the semiconductor apparatus 100 is to be inserted. The through hole 38 penetrates to the cooler 10.

The control electrode 61 and the control terminal 83, which correspond to each other, are electrically connected to each other via the wiring member W. A conductive wire (bonding wire) is used for the wiring member W. As a material for the conductive wire, any one of gold, copper, aluminum, a gold alloy, a copper alloy, and an aluminum alloy or their combination can be used. A member other than the conductive wire can also be used as the wiring member. For example, a ribbon can be used for the wiring member.

Figure 7:
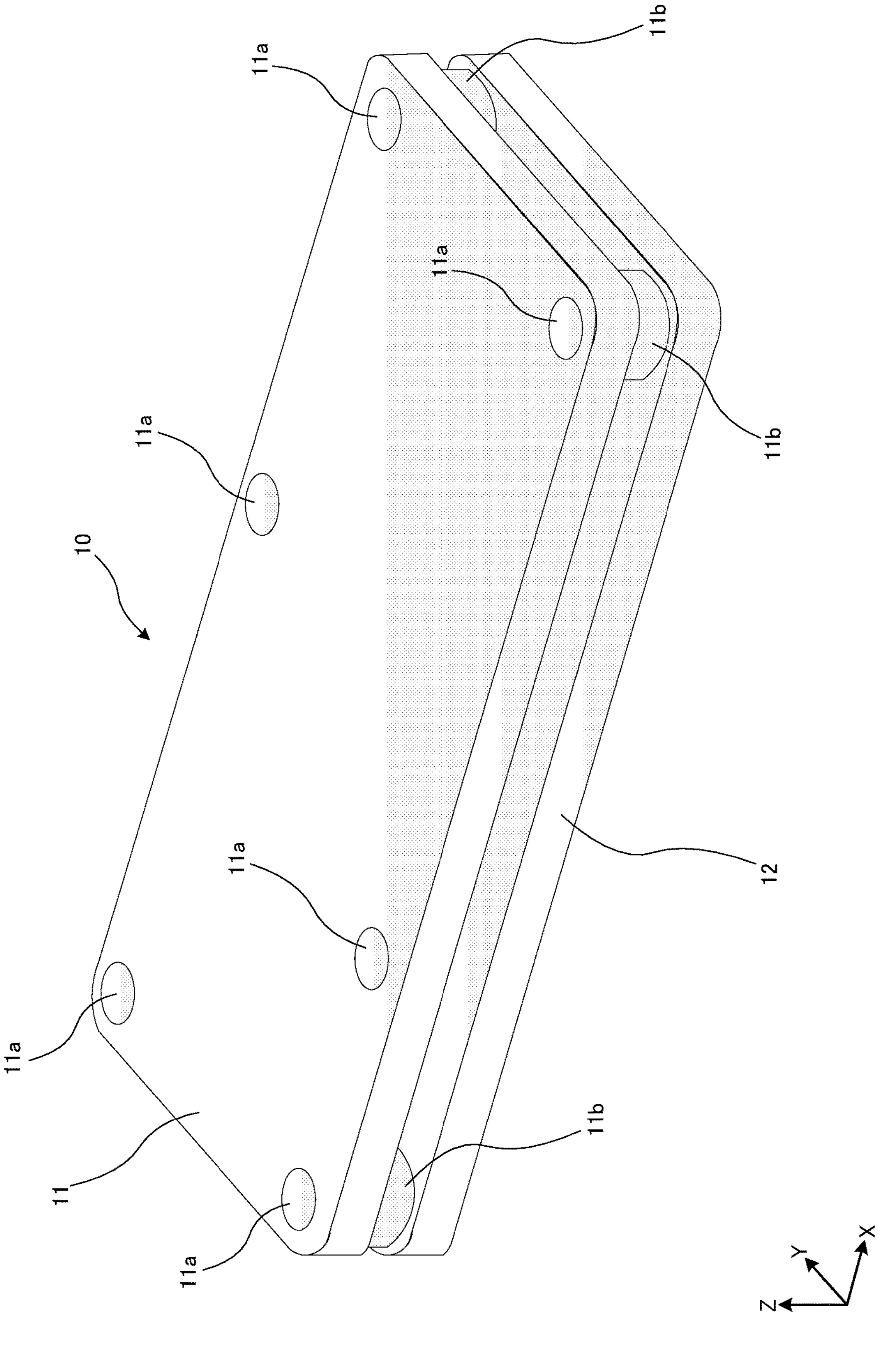
FIG. 7 is a schematic perspective view of a cooler according to the present embodiment.
Figure 8:
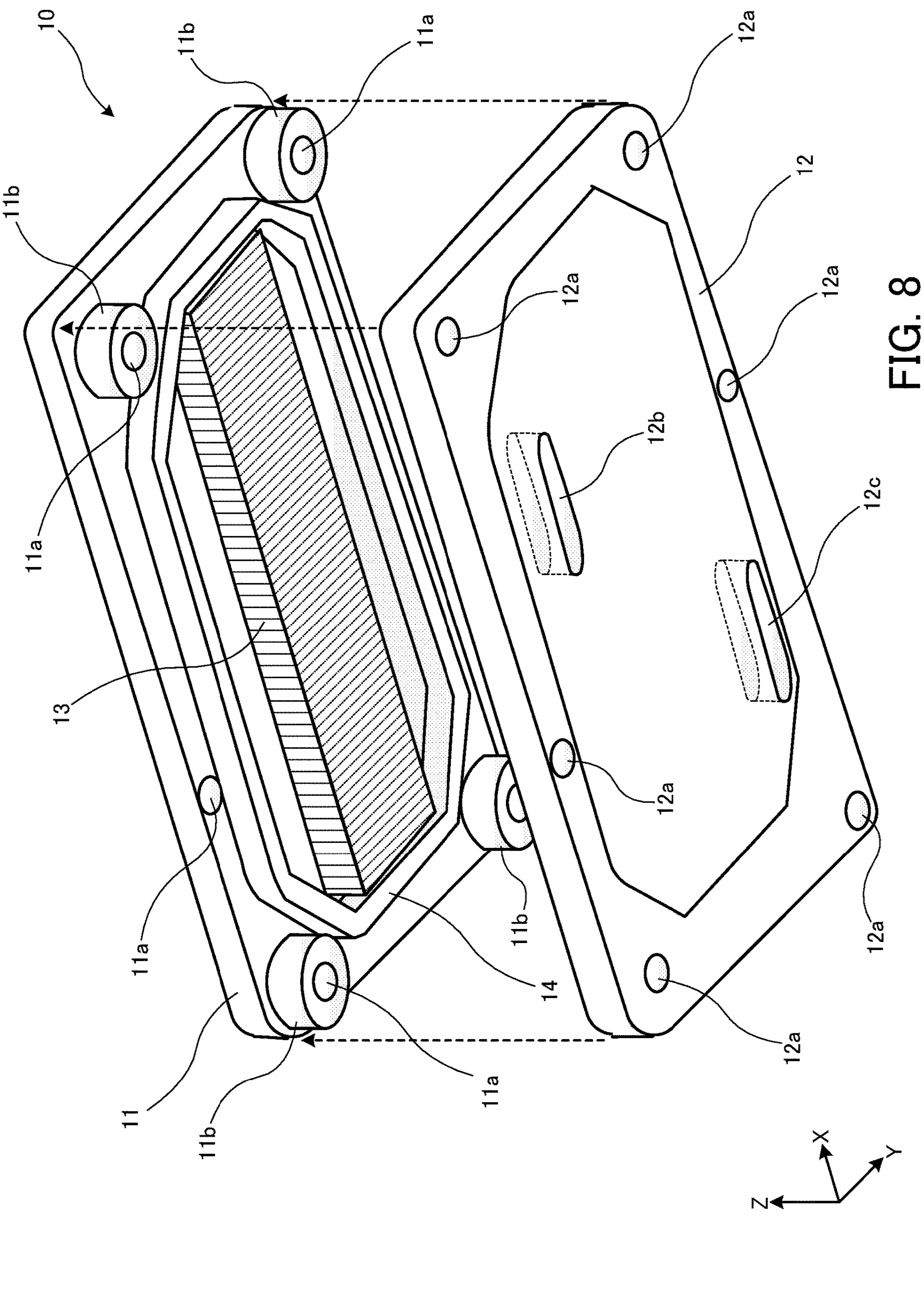
FIG. 8 is a schematic exploded perspective view of the cooler illustrated in FIG. 7.

Then, a detailed structure of a cooler will be described with reference to FIGS. 7 to 9. FIG. 7 is a schematic perspective view of a cooler according to the present embodiment. FIG. 8 is a schematic exploded perspective view of the cooler illustrated in FIG. 7. FIG. 9 is a rear view of the semiconductor apparatus according to the present embodiment. In FIG. 8, a plurality of fins are represented by a rectangular parallelepiped for convenience of illustration.

As illustrated in FIGS. 7 to 9, the cooler 10 is formed into a box type obtained by bonding and integrating the top plate 11 and the bottom plate 12. The cooler 10 is formed of a metal having a good heat dissipation property. The cooler 10 may be formed of aluminum, an aluminum alloy, copper, or a copper alloy, for example.

The top plate 11 has a rectangular shape in a planar view, and is formed of a plate-shaped body having a predetermined thickness. An outer shape of the top plate 11 corresponds to an outer shape of the case 3. The top plate 11 has its longitudinal direction extending in the left-right direction (X-direction) of the semiconductor apparatus 100, and has its direction perpendicular to the longitudinal direction extending in the front-rear direction (Y-direction) of the semiconductor apparatus 100. The top plate 11 has one surface (lower surface) and the other surface (upper surface). The one surface forms a heat dissipation surface that dissipate heat of the semiconductor device 6. The other surface forms a surface to be bonded to the laminate substrate 5.

The plurality of fins 13 are provided on the lower surface of the top plate 11. The plurality of fins 13 are arranged in the longitudinal direction of the top plate 11. More specifically, the plurality of fins 13 are respectively arranged in corresponding portions just below the three semiconductor units 2.

For example, a pin fin obtained by arranging a plurality of pins having a square columnar shape (square pins) at a predetermined pitch with gaps thereamong can be used as the fin 13. The plurality of fins 13 may be formed of the same metal material as that of the top plate 11, for example. The plurality of fins 13 may be provided integrally with the top plate 11, or may be provided by brazing, implantation, cutting, or plastic working, for example, in the top plate 11.

A peripheral wall section 14 surrounding the outer periphery of the plurality of fins 13 is provided on the lower surface of the top plate 11. The peripheral wall section 14 protrudes at a predetermined height toward the positive side in the Z-direction from an upper surface of the bottom plate 12. The peripheral wall section 14 is formed into a larger frame shape than an outer shape of a set formed of the plurality of fins 13. The protrusion height of the peripheral wall section 14 is preferably equal to the protrusion height of the fins 13. The peripheral wall section 14 may be provided integrally with the top plate 11. The top plate 11 may be referred to as a cooling case.

The top plate 11 has a plurality of through holes 11*a* formed along its outer peripheral edge. The through holes 11*a* are respectively arranged to correspond to the through holes 38 formed in the case 3. Cylindrical sections 11*b* each having the same protrusion height as that of the fins 13 and the peripheral wall section 14 may be respectively provided at four corners of the top plate 11.

The bottom plate 12 has a rectangular shape in a planar view having the same shape as that of the top plate 11, and is arranged to oppose the top plate 11 just below the top plate 11 with a gap therebetween by the height of the peripheral wall section 14. The bottom plate 12 is preferably formed of an aluminum alloy having the same material as that of the top plate 11. The bottom plate 12 has a plurality of through holes 12*a* formed along its outer peripheral edge. The through holes 12*a* are respectively arranged to correspond to the through holes 38 formed in the case 3 and the through holes 11*a* formed in the top plate 11. That is, the through holes 38, 11*a*, and 12*a* are arranged to overlap one another in a planar view.

The top plate 11 is bonded by being brazed, for example, to respective distal ends (lower ends) of the peripheral wall section 14 and the plurality of fins 13, described above. As a result, a lower opening of a cooling case is closed. Accordingly, a flow path of a refrigerant is formed of a space surrounded by the top plate 11, the bottom plate 12, the plurality of fins 13, and the peripheral wall section 14. Cooling water, for example, is used as the refrigerant, and a physical property of the refrigerant is appropriately changeable.

An inlet port 12*b* and a discharge port 12*c* of a refrigerant for the cooler 10 are respectively formed in predetermined portions of the bottom plate 12. The inlet port 12*b* and the discharge port 12*c* are each formed of a through hole that penetrates the bottom plate 12 in the thickness direction. Specifically, the inlet port 12*b* and the discharge port 12*c* are arranged to obliquely oppose each other with the plurality of fins 13 sandwiched therebetween in the Y-direction.

The inlet port 12*b* and the discharge port 12*c* each have an elongated shape extending in the X-direction in a planar view. For example, a shape of each of the inlet port 12*b* and the discharge port 12*c* is an elliptical shape that is short in the direction perpendicular to the longitudinal direction of the cooler 10 and is long in the longitudinal direction. Respective shapes and arrangement portions of the inlet port 12*b* and the discharge port 12*c* are not limited to these, but are appropriately changeable.

The semiconductor module 1 and the cooler 10 are coupled to each other using an adhesive or the like. In this case, when the semiconductor module 1 and the cooler 10 are combined with each other, it is important to align the case 3 and the cooler 10 (the top plate 11) with each other. For example, a columnar metal component (positioning pin) integrally molded to the case 3 side and a hole or a notch formed on the cooler 10 side have conventionally been fitted to each other to implement alignment therebetween.

However, the positioning pin on the case 3 side may be formed of a metal material to ensure rigidity. The cooler 10 adopts a metal material having a good thermal conductivity from the viewpoint of a cooling performance. Accordingly, when the case 3 and the cooler 10 are positioned relative to each other, the metal materials are rubbed against each other, whereby metal powder may be generated. Particularly, the metal powder may cause a short for an electrical wiring and an electrical device arranged in its periphery. When the metal powder is mixed into the cooler 10, a refrigerant flow path inside the cooler 10 is soiled, which may cause a factor for generating rust or the like.

On the other hand, to prevent the metal materials from contacting each other, a clearance between the metal materials may be sufficiently ensured. However, if the clearance is too ensured, there may occur a problem that an original positioning function cannot be sufficiently exhibited so that a positioning accuracy as the entire apparatus cannot be sufficiently ensured.

The inventors of the present invention have paid attention to respective materials for the case 3 and the cooler 10 to conceive the present invention for the purpose of improving a positioning accuracy between the case 3 and the cooler 10 while preventing metal powder from being generated. For example, in the present invention, when a protrusion 39 formed of the same material (resin material) as that for a case body is provided on the case 3 side, and the protrusion 39 is fitted in a notch 15 provided on the cooler 10 side, to implement positioning between the case 3 and the cooler 10. The protrusion may be thermoplastic resin, for example. Alternatively, the protrusion may be thermosetting resin. Further, the protrusion has an inorganic filer mixed into its resin. The protrusion may be formed integrally with the case body. This makes it possible to perform positioning between the case 3 and the cooler 10 with high accuracy without generating metal powder.

Figure 10A:
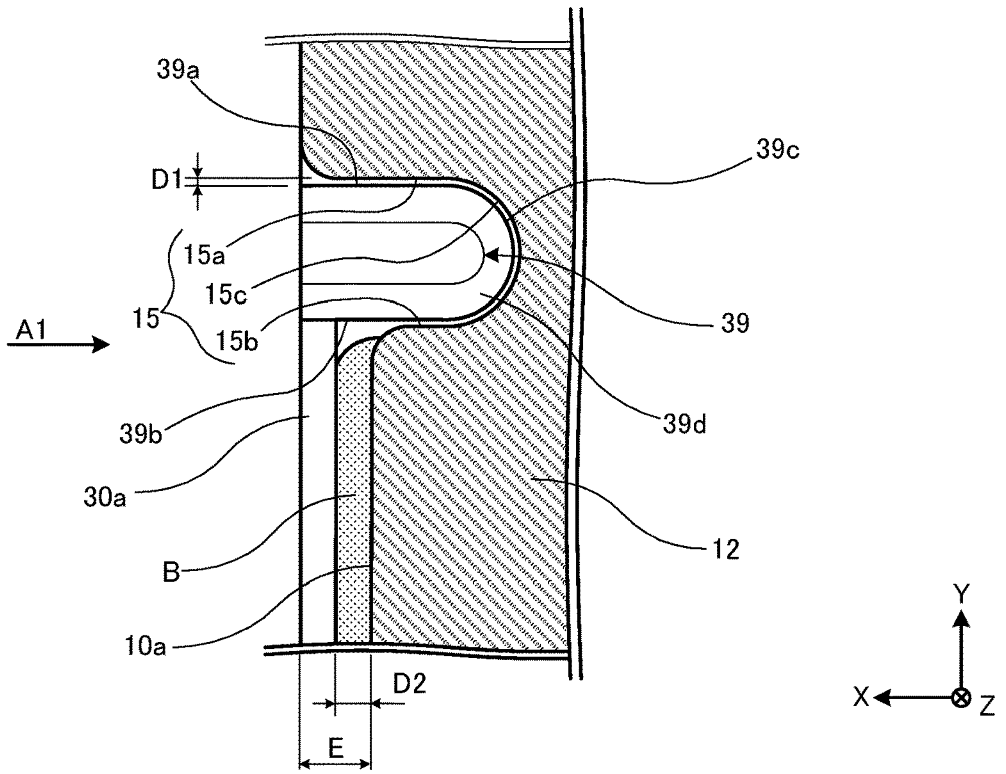
FIGS. 10A and 10B are enlarged views of the periphery of a portion A illustrated in FIG. 9.
Figure 10B:
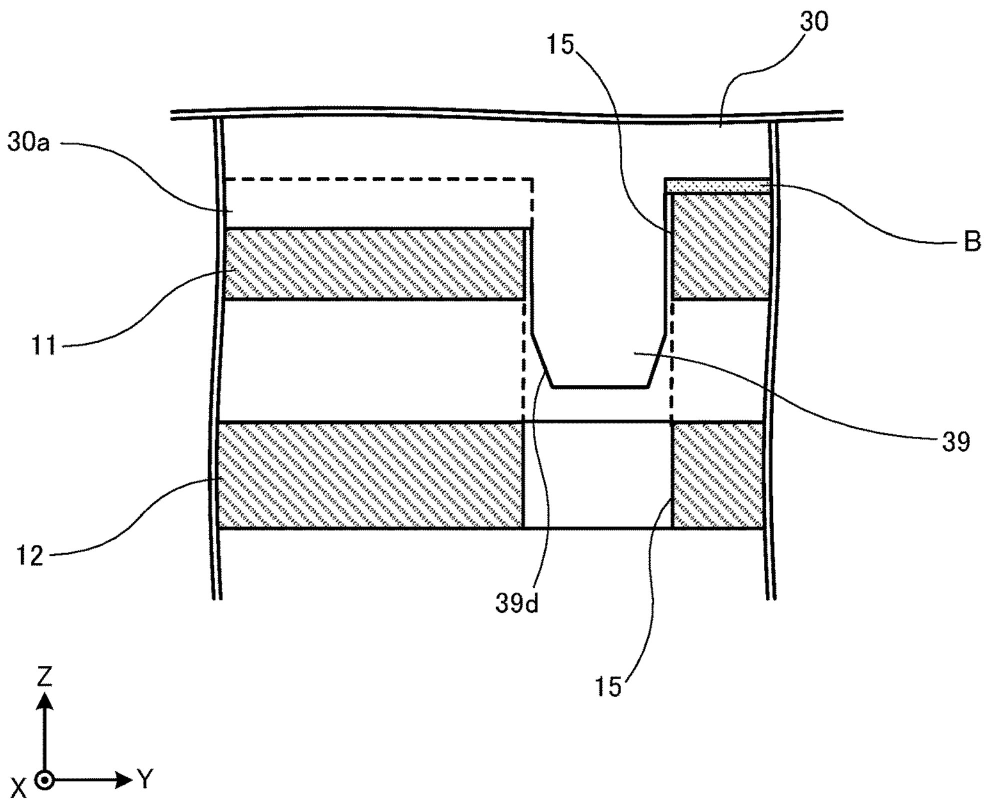
Figure 11A:
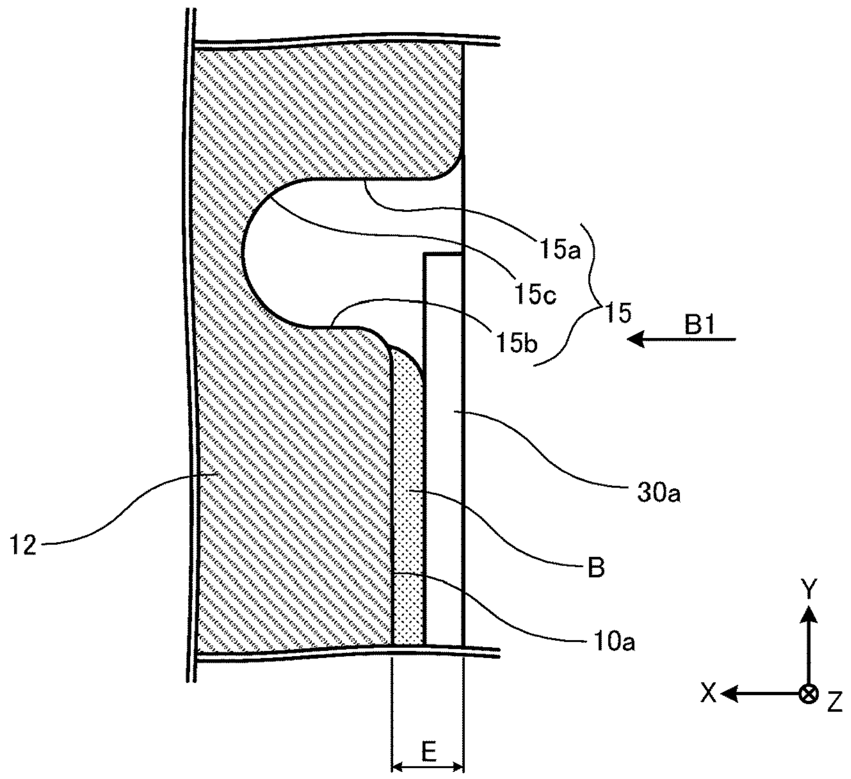
FIGS. 11A and 11B are enlarged views of the periphery of a portion B illustrated in FIG. 9.
Figure 11B:
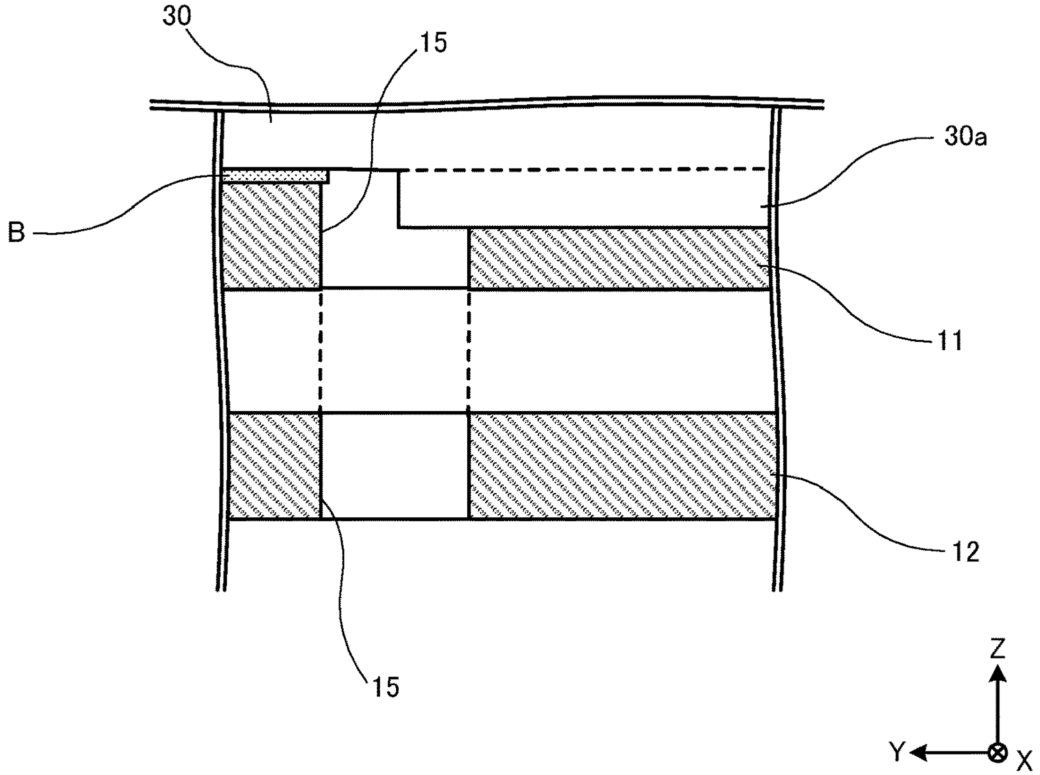

A detailed structure of the semiconductor apparatus according to the present embodiment will be described with reference to FIGS. 9 to 11. FIG. 10A is an enlarged view of the periphery of a portion A illustrated in FIG. 9, and FIG. 10B is a side view viewed from an arrow A1 illustrated in FIG. 10A. Similarly, FIG. 11A is an enlarged view of the periphery of a portion B illustrated in FIG. 9, and FIG. 11B is a side view viewed from an arrow B1 illustrated in FIG. 11A.

As illustrated in FIGS. 9 to 11, in the present embodiment, the protrusion 39 protruding downward from a bottom surface of the side wall 30 forming a rectangular frame is formed in the case 3. Particularly as illustrated in FIG. 10A, the protrusion 39 has a flat shape in a planar view extending in the X-direction. Specifically, the protrusion 39 includes a pair of straight sections 39*a* and 39*b* extending in a vertical direction (X-direction) from an outer side surface of the side wall 30 in a planar view and a circular arc section 39*c* communicating with the straight sections 39*a* and 39*b* and curved in a circular arc shape.

That is, the protrusion 39 may include a portion having a J shape in a planar view including the straight section 39*a* and the circular arc section 39*c*. The circular arc section 39*c* may have a semi-circular shape. The length of the straight section 39*a* may be larger than the diameter of the circular arc section 39*c*.

More specifically, the protrusion 39 may have a U shape in a planar view by respectively connecting the pair of straight sections 39*a* and 39*b* opposing each other to both ends of the circular arc section 39*c*. That is, the protrusion 39 may have a U shape including the two straight sections 39*a* and 39*b* parallel to each other and the circular arc section 39*c* having a semi-circular shape connected therebetween. The circular arc section 39*c* is not limited to that having a circular arc shape, but may have any shape if it includes a portion curved to be convex in a direction away from the straight sections 39*a* and 39*b* or the side wall 30 (curve convex toward the inside of the module). The circular arc section 39*c* may be referred to as a curved section.

The notch 15 that is engageable with the protrusion 39 is formed in the top plate 11 to correspond to the protrusion 39. The notch 15 has a complementary shape forming a predetermined gap D1 with respect to the protrusion 39 in a planar view. Specifically, the notch 15 includes a pair of straight sections 15*a* and 15*b* extending in the vertical direction (X-direction) from an outer side surface of the top plate 11 in a planar view and a circular arc section 15*c* communicating with the straight sections 15*a* and 15*b* and curved in a circular arc shape.

The circular arc section 15*c* may have a semi-circular shape. That is, the notch 15 may include a portion having a J shape including the straight section 15*a* and the circular arc section 15*c*. The notch 15 includes the straight section 15*a* forming a predetermined gap D1 with respect to the straight section 39*a* of the protrusion 39 to extend parallel therewith, the straight section 15*b* forming a predetermined gap D1 with respect to the straight section 39*b* to extend parallel therewith, and the circular arc section 15*c* forming a predetermined gap D1 with respect to the circular arc section 39*c* of the protrusion 39 to concentrically extend. The circular arc section 15*c* may have a semi-circular shape.

More specifically, the notch 15 may have a U shape in a planar view by respectively connecting the pair of straight sections 15*a* and 15*b* opposing each other to both ends of the circular arc section 15*c*. That is, the notch 15 may have a U shape including the two straight sections 15*a* and 15*b* parallel to each other and the circular arc section 15*c* having a semi-circular shape connected therebetween. The straight section 15*a* on the positive side in the Y direction may be longer in the X-direction than the straight section 15*b* on the negative side in the Y-direction.

The straight section 15*a* opposes the straight section 39*a* with a predetermined gap D1 therebetween. The straight section 15*b* opposes the straight section 39*b* with a predetermined gap D1 therebetween. The two straight sections 15*a* and 15*b* may be each referred to as a second straight section. The circular arc section 15*c* opposes the circular arc section 39*c* with a predetermined gap D1 therebetween. The circular arc section 15*c* is not limited to that having a circular arc shape, but may have any shape if it includes a portion curved to be convex in a direction away from the straight sections 15*a* and 15*b* (toward the inside of the module), i.e., a curved shape convex inward the semiconductor module. The circular arc section 15*c* may be referred to as a curved section (second curved section).

The predetermined gap D1 between the protrusion 39 and the notch 15 may be 0 or more and 0.2% or less of the length in the longitudinal direction (X-direction) of the semiconductor module 1, for example. The predetermined gap D1 may be more preferably more than 0 and 0.1% or less of the length in the longitudinal direction (X-direction) of the semiconductor module 1.

In the present embodiment, the protrusion 39 made of resin and the notch 15 made of a metal are fitted to each other to perform positioning between the case 3 and the cooler 10, thereby making it more difficult to generate metal powder than when metal materials are fitted to each other. Accordingly, the gap D1 between the protrusion 39 and the notch 15 can be more severely set than that in conventional fitting between metal materials. This makes it possible to improve a positioning accuracy between the case 3 and the cooler 10.

The protrusion 39 includes the circular arc section 39*c* and the notch 15 includes the circular arc section 15*c*, whereby positioning in an XY planar direction between the case 3 and the cooler 10 can be implemented with high accuracy when the circular arc sections 39*c* and 15*c* are fitted to each other with the centers of their circles respectively used as reference points. The protrusion 39 includes the straight section 39*a* and the notch 15 includes the straight section 15*a*, whereby the side surface of the straight section 39*a* and the side surface of the straight section 15*a* contact each other when the protrusion 39 and the notch 15 engage with each other so that a relative rotation around a Z-axis between the case 3 and the cooler 10 is regulated. That is, the single protrusion 39 makes it possible to implement positioning in the XY planar direction and around the Z-axis with high accuracy.

As illustrated in FIG. 10B, a distal end of the protrusion 39 protrudes more downward (in the −Z direction) than the lower surface of the top plate 11. This makes it possible to appropriately fit the case 3 and the cooler 10 (the top plate 11) to each other. The distal end of the protrusion 39 is positioned above (in the +Z-direction) a lower surface of the bottom plate 12. That is, the distal end of the protrusion 39 does not protrude more downward (in the −Z direction) than the lower surface of the bottom plate 12. As a result, when an external device is assembled below the bottom plate 12, the protrusion 39 does not interfere with the assembly.

Further, a tapered inclined surface 39*d* (that may be referred to as a tapered surface or a chamfer) is formed at the distal end of the protrusion 39. The distal end of the protrusion 39 is thus tapered, thereby making it possible to appropriately fit the case 3 and the cooler 10 (the top plate 11) to each other with the inclined surface 39*d* used as a guide surface even if there is a slight shift in position when the protrusion 39 and the notch 15 are fitted to each other (engage with each other).

As illustrated in FIGS. 4, 5, and 9, the case 3 includes skirt sections 30*a* and 31*b* each extending in a predetermined thickness downward along respective outer side surfaces of the side walls 30 and 31. Each of the skirt sections 30*a* and 31*b* covers at least a part of the outer side surface of the top plate 11. Particularly as illustrated in FIG. 9, each of the skirt sections 30*a* and 31*b* extends in a predetermined direction (the X-direction or the Y-direction) along a side of the cooler 10. A side surface of the cooler 10 (the top plate 11 and/or the bottom plate 12) is recessed inward in portions respectively corresponding to the skirt sections 30*a* and 31*b*.

More specifically, the through holes 11*a* and 12*a* for fastening an external device are formed, as described above, in the cooler 10. The cooler 10 protrudes outward on peripheries of the through holes 11*a* and 12*a* and has recesses 10*a* recessed inward formed on its side surfaces between the through holes 11*a* and 12*a* and the through holes 11*a* and 12*a* in a planar view. The above-described skirt sections 30*a* and 31*b* are each formed on a side wall (a portion corresponding to the recess 10*a*) between the through hole 38 and the through hole 38, and is not formed on a side wall around the through hole 38. This makes it possible to ensure a strength when the external device is fastened and prevent the semiconductor apparatus 100 from being damaged. The recess 10*a* may be formed on either one or both of the side surface of the top plate 11 and the side surface of the bottom plate 12.

As illustrated in FIG. 10, the skirt section 30*a* on the positive side in the X-direction has a portion connected to the protrusion 39. Specifically, the skirt section 30*a* extends at a right angle from an end portion on the outer side surface side of the straight section 39*b* in the protrusion 39. That is, the protrusion 39 is formed at one end of the skirt section 30*a* to extend inward (toward the negative side in the X-direction in FIG. 10) continuously from the skirt section 30*a*. The distal end of the protrusion 39 protrudes more downward than a lower end of the skirt section 30*a*. Further, the lower end of the skirt section 30*a* is at a position higher than the lower surface of the top plate 11 (a position on the +Z side). That is, the lower end of the skirt section 30*a* does not protrude more downward than the lower surface of the top plate 11.

A gap D2 is formed between the skirt section 30*a* and the side surface of the cooler 10 (the top plate 11). Further, an adhesive B is interposed in the gap D2. The gap D2 is larger than the gap D1 between the protrusion 39 and the notch 15. The gap D2 between the skirt section 30*a* and the cooler 10 (the top plate 11) may be not less than 1.2 times nor more than 10 times of the gap D1, for example. More preferably, the gap D2 may be not less than 1.5 times nor more than 5.0 times of the gap D1.

The skirt section 30*a* covers the outer side surface of the top plate 11, thereby making it possible to prevent the adhesive B between the case 3 and the top plate 11 from exuding from the outer surface of the case 3. Further, the excessive adhesive B can be stored in the gap D2 between the skirt section 30*a* and the cooler 10. That is, the skirt sections 30*a* and 31*b* each function as a wall that regulates a flow of the adhesive B. The lower end of the skirt section 30*a* does not protrude more downward than the lower surface of the top plate 11, thereby making it possible to prevent the skirt section 30*a* from being damaged when a side portion of the cooler 10 is handled.

Figure 14A:
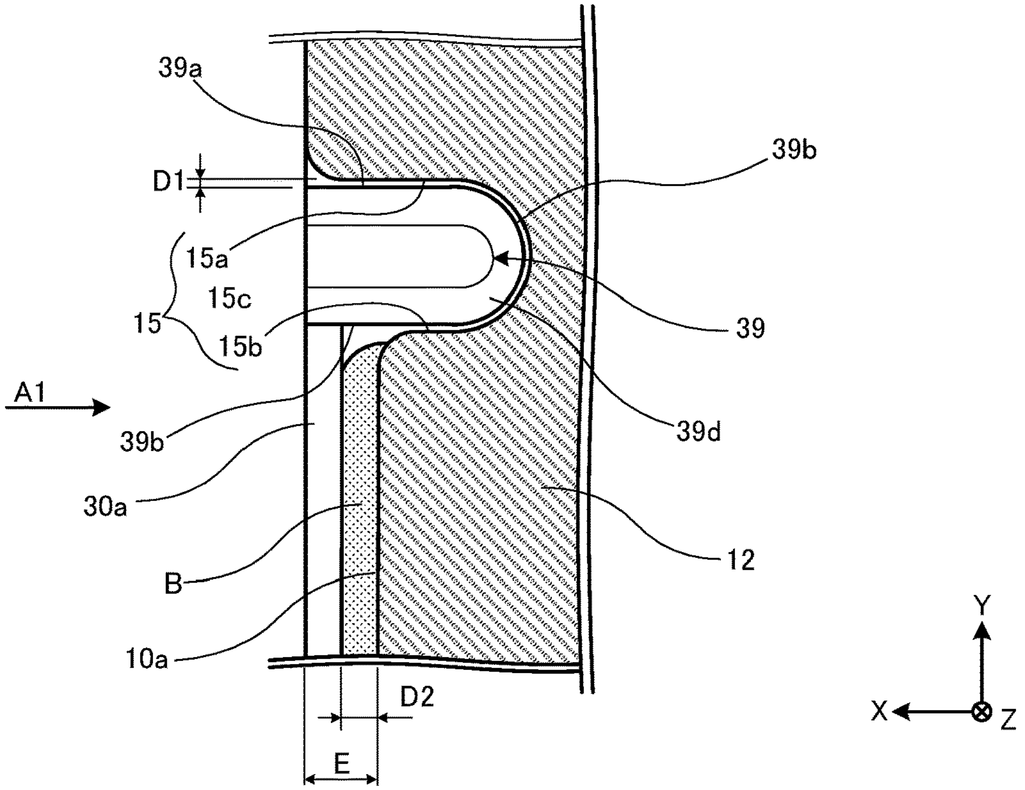
FIGS. 14A and 14B are partially enlarged views corresponding to FIG. 10 of the semiconductor apparatus according to the modification.

The notch 15 is formed in an end portion of a portion recessed inward (the recess 10*a*) in the cooler 10. Particularly as illustrated in FIG. 10A (similarly in FIGS. 11A and 14A, described below), a step E is provided on the side surface of the cooler 10 in a portion of the notch 15 (a portion where the notch 15 is formed). That is, the step E that has shifted in the X-direction is provided between the side surface of the cooler 10 where the recess 10*a* is not formed and a side surface of the recess 10*a*.

In the present embodiment, the notch 15 is formed in not only the top plate 11 but also the bottom plate 12. The notch 15 in the bottom plate 12 is formed in a corresponding portion just below the notch 15 in the bottom plate 12 in the same shape. The notch 15 in the bottom plate 12 may be referred to as a second notch. The distal end of the protrusion 39 may be positioned below the lower surface of the top plate 11 and above the upper surface of the bottom plate 12. That is, the protrusion 39 may engage with the notch 15 in the top plate 11 and need not engage with the notch 15 in the bottom plate 12. Accordingly, when an external device is connected, for example, a positioning guide of the external device engages with the notch 15 (the second notch) in the bottom plate 12, thereby making it possible to perform positioning between the semiconductor module 1 and the external device.

The notch 15 in the bottom plate 12 is used to align the top plate 11 and the bottom plate 12 when the cooler 10 is assembled. That is, the top plate 11 and the bottom plate 12 can be positioned with high accuracy when arranged such that the notch 15 in the top plate 11 and the notch 15 in the bottom plate 12 are arranged to overlap each other in a planar view. Accordingly, the protrusion 39 need not engage with the notch 15 in the bottom plate 12. Thus, the notch 15 according to the present embodiment is used not only for positioning between the case 3 and the cooler 10 but also positioning at the time of assembly of the cooler 10 itself (assembly of the top plate 11 and the bottom plate 12).

As described above, the top plate 11 has a rectangular shape in a planar view to correspond to the case 3, and the notches 15 are respectively formed on a pair of side surfaces opposing each other in the longitudinal direction of the top plate 11. Further, the notches 15 in the top plate 11 (the bottom plate 12) are arranged to be symmetrical with each other with respect to a Y-axis (at the same portion in the X-direction).

On the other hand, the protrusion 39 on the case 3 side is formed in only the side wall 30 (on the positive side in the X-direction) in the pair of side walls 30 opposing each other in the longitudinal direction. As described above, the protrusion 39 can perform positioning in the XY planar direction and around the Z-axis alone because it has a flat shape extending in the X-direction.

In this respect, as illustrated in FIGS. 11A and 11B, the notch 15 is formed but the protrusion 39 is not formed on the other sidewall 30 side. Accordingly, when an external device is connected, for example, the positioning guide of the external device engages with the notch 15 on the other side wall 30 side, thereby making it possible to perform positioning between the semiconductor module 1 and the external device. An end portion of the skirt section 30*a* provided on the other side wall 30 is provided at a position overlapping the notch 15 in a side view. When a part of the notch 15 is covered with the skirt section 30*a*, the adhesive B is also prevented from exuding around the portion B.

As described above, according to the present embodiment, the protrusion 39 made of resin and the notch 15 made of a metal are fitted to each other, thereby making it possible to improve a positioning accuracy between the case 3 and the cooler 10 while preventing metal powder from being generated.

Figure 12:
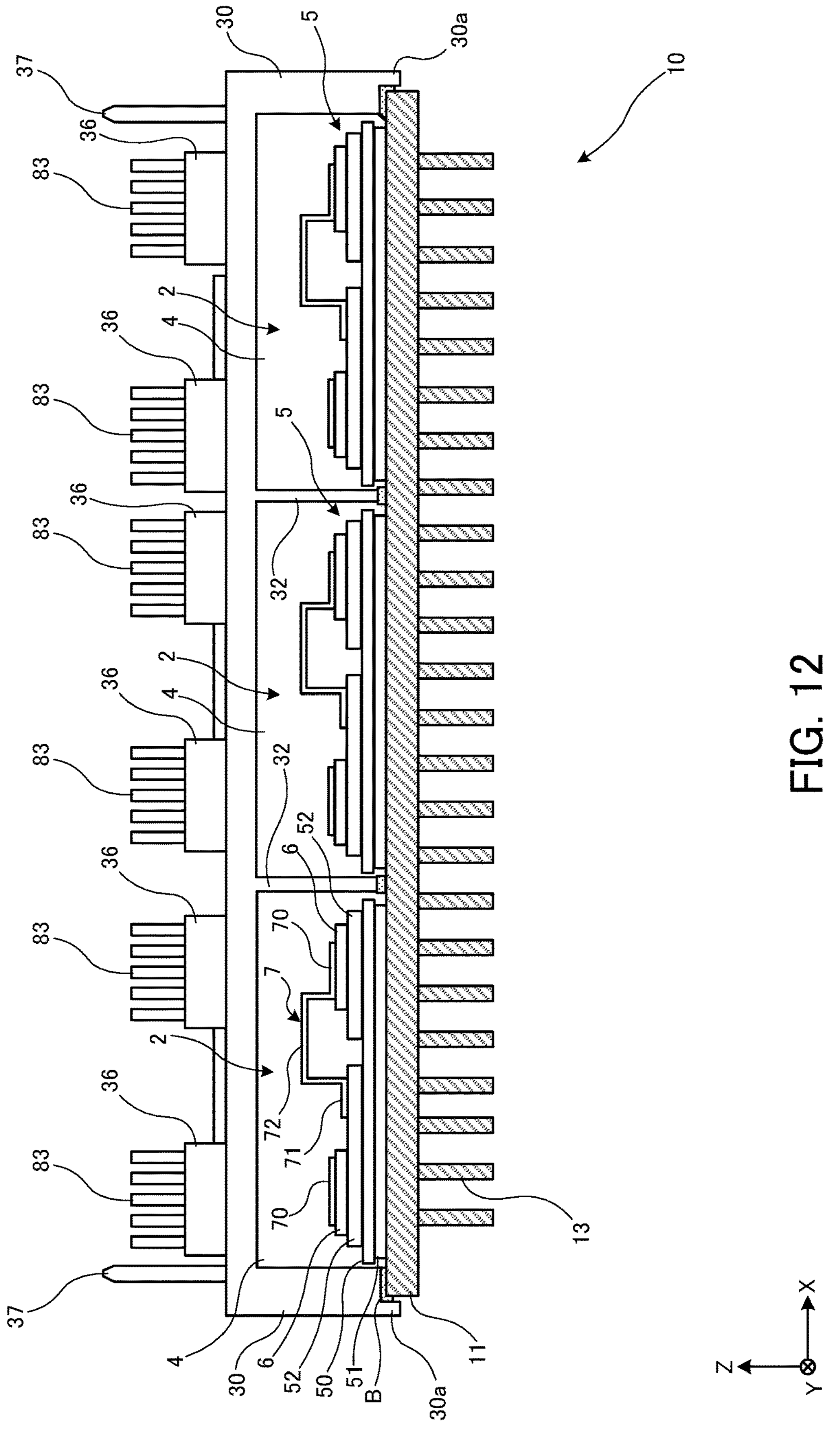
FIG. 12 is a cross-sectional view corresponding to FIG. 4 of a semiconductor apparatus according to a modification.
Figure 13:
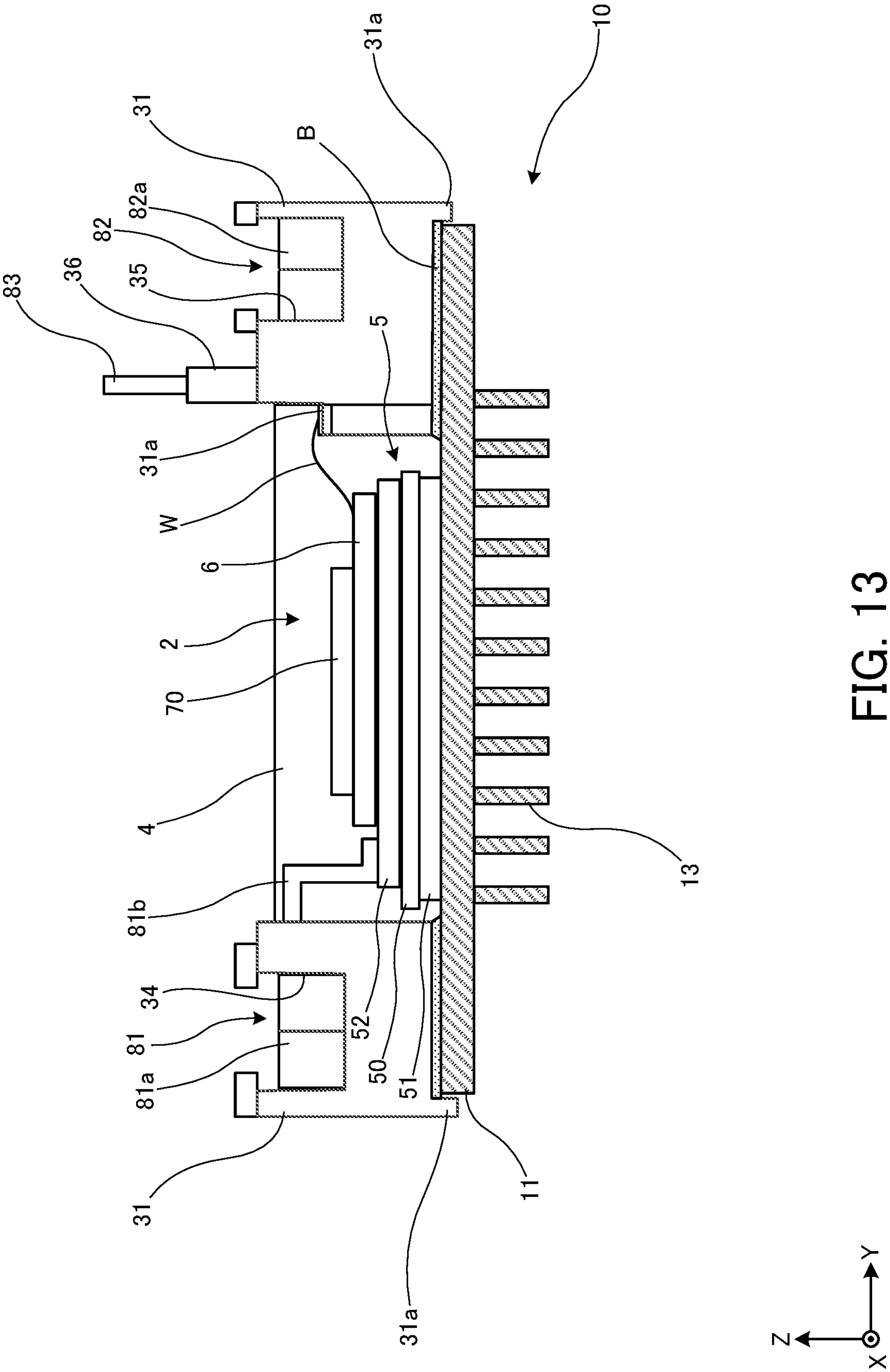
FIG. 13 is a cross-sectional view corresponding to FIG. 5 of the semiconductor apparatus according to the modification.
Figure 14B:
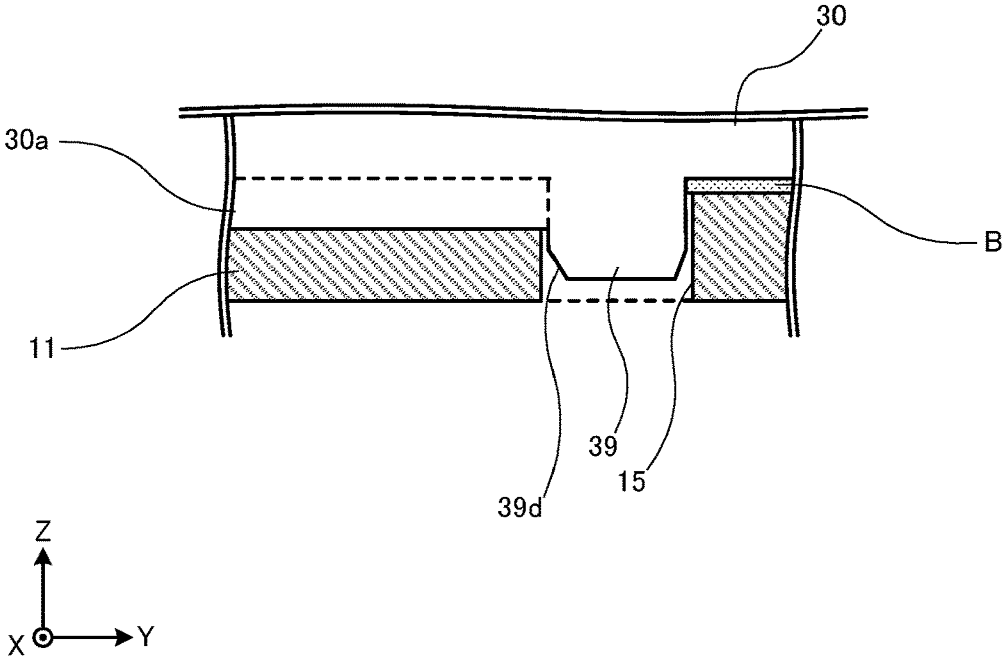
Figure 15:
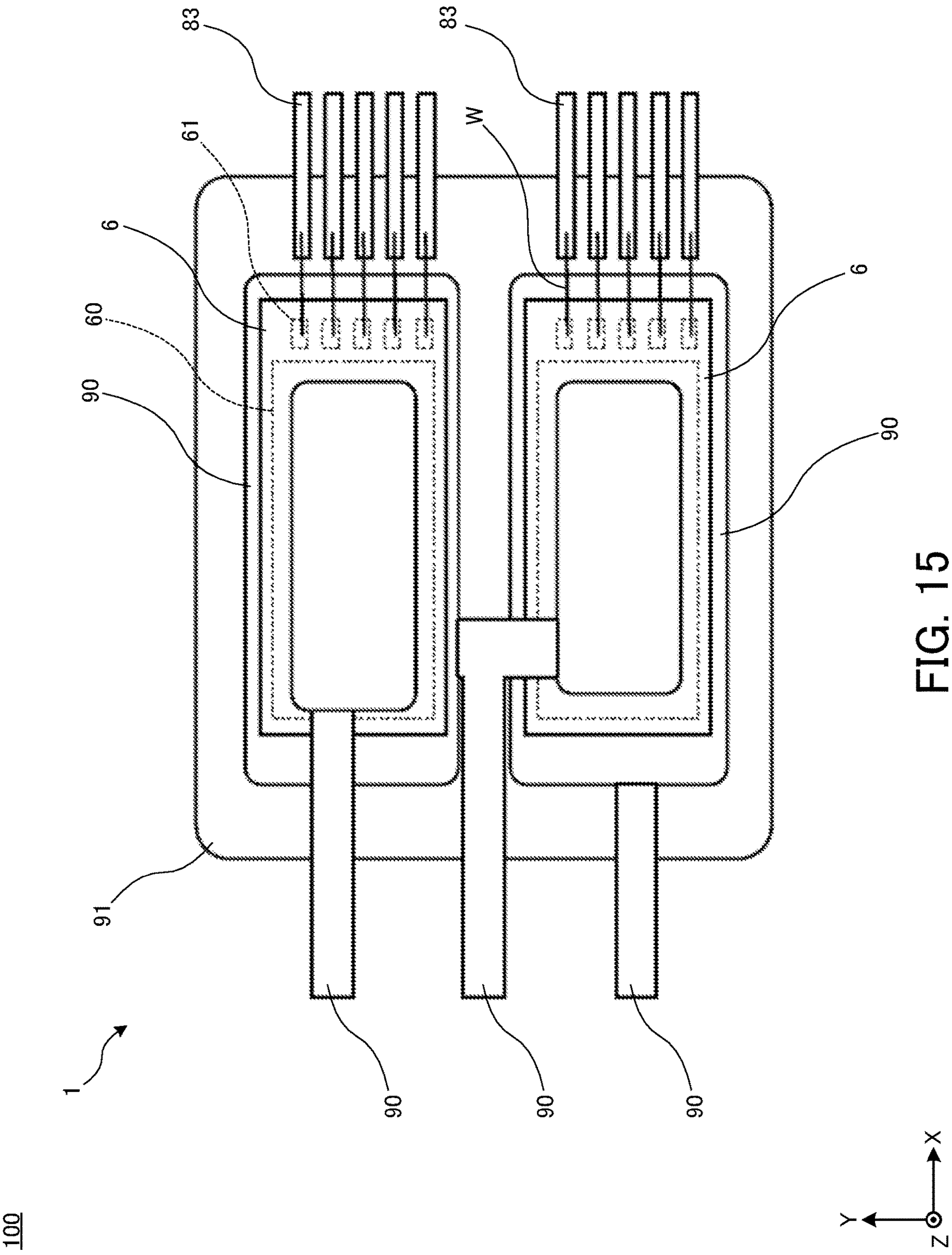
FIG. 15 is a plan view of a semiconductor apparatus according to another modification.
Figure 16:
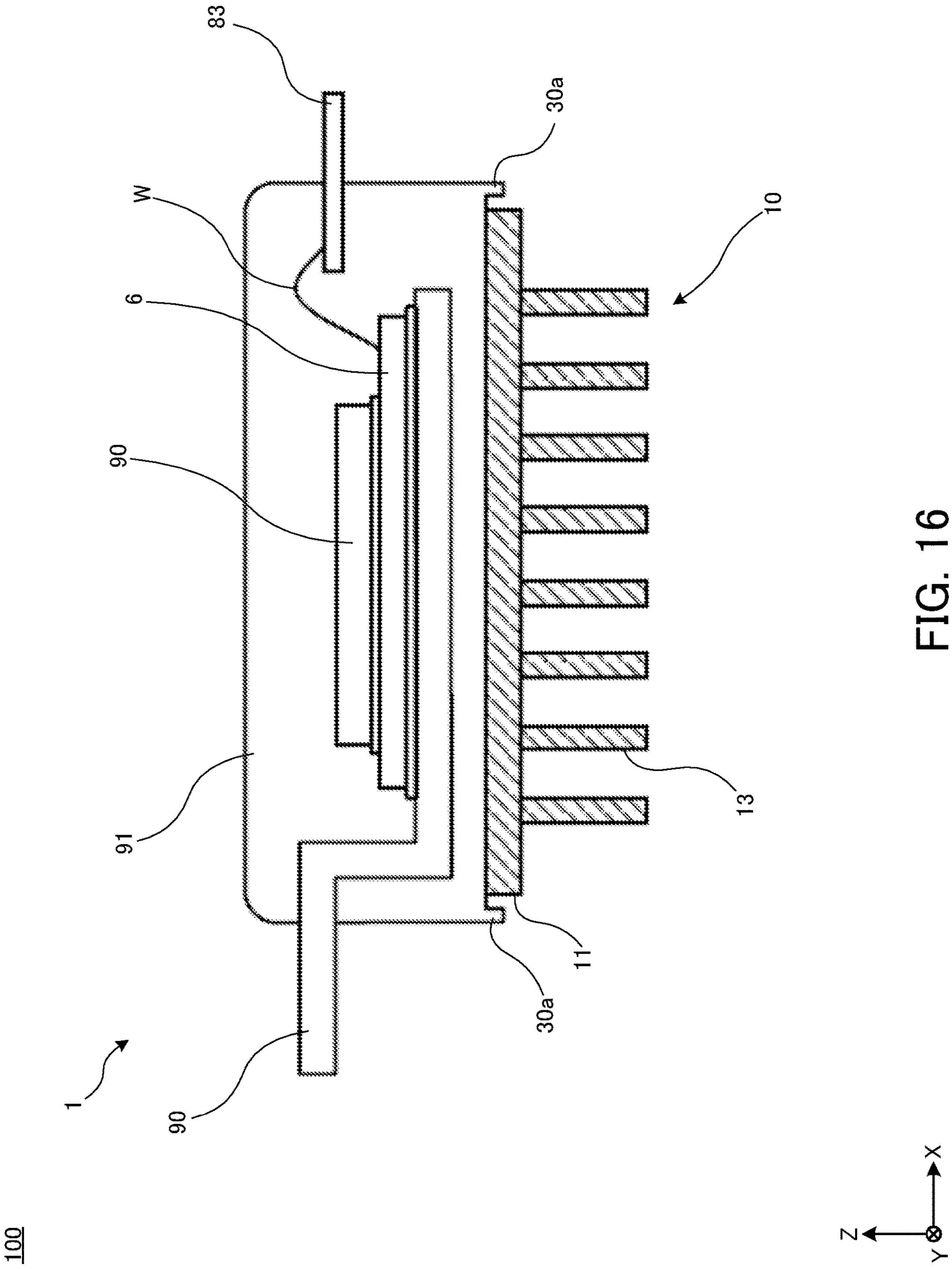
FIG. 16 is a cross-sectional view of the semiconductor apparatus illustrated in FIG. 15.

Then, a modification will be described with reference to FIGS. 12 to 16. FIG. 12 is a cross-sectional view corresponding to FIG. 4 of a semiconductor apparatus according to the modification. FIG. 13 is a cross-sectional view corresponding to FIG. 5 of the semiconductor apparatus according to the modification. FIG. 14 is a partially enlarged view corresponding to FIG. 10 of the semiconductor apparatus according to the modification. FIG. 15 is a plan view of a semiconductor apparatus according to another modification. FIG. 16 is a cross-sectional view of the semiconductor apparatus illustrated in FIG. 15.

Although a case where the cooler 10 is configured to be of a close type formed by bonding the top plate 11 and the bottom plate 12 in the above-described embodiment, the present invention is not limited to this configuration, but is appropriately changeable. For example, the cooler 10 may be configured to be of an open type in which a plurality of fins 13 is exposed to the outside by omitting the bottom plate 12, as illustrated in FIGS. 12 to 14. In this case, a distal end of a protrusion 39 is preferably at a position (a position on the +Z-side) higher than a lower surface of a top plate 11, as illustrated in FIG. 14. That is, the distal end of the protrusion 39 remains inside in the thickness direction of the top plate 11, and does not protrude more downward than the lower surface of the top plate 11. As a result, when a cover that covers the plurality of fins is assembled, the distal end of the protrusion 39 does not interfere with the assembly.

Although a case where the semiconductor module 1 includes the case 3 previously molded in a frame shape has been described in the above-described embodiment, the present invention is not limited to this configuration. For example, the semiconductor module 1 may have a configuration illustrated in FIGS. 15 and 16. The semiconductor module 1 illustrated in FIGS. 15 and 16 is a module of a full mold type, and does not have a laminate substrate 5. Instead, metal wiring boards 90 independent of each other are respectively bonded to an upper surface and a lower surface of a semiconductor device 6. That is, the semiconductor device 6 is sandwiched between at least two metal wiring boards 90. The semiconductor device 6 and the metal wiring board 90 and other control terminals 83 and wiring members W are covered with mold resin 91 and are sealed. That is, the mold resin 91 functions as the case 3 and the sealing resin 4. In this case, the protrusion 39 and the skirt sections 30*a* and 31*b*, described above, may be formed in the mold resin 91. The mold resin 91 is formed by transfer molding, for example. The mold resin 91 may be referred to as a resin section.

Figure 17:
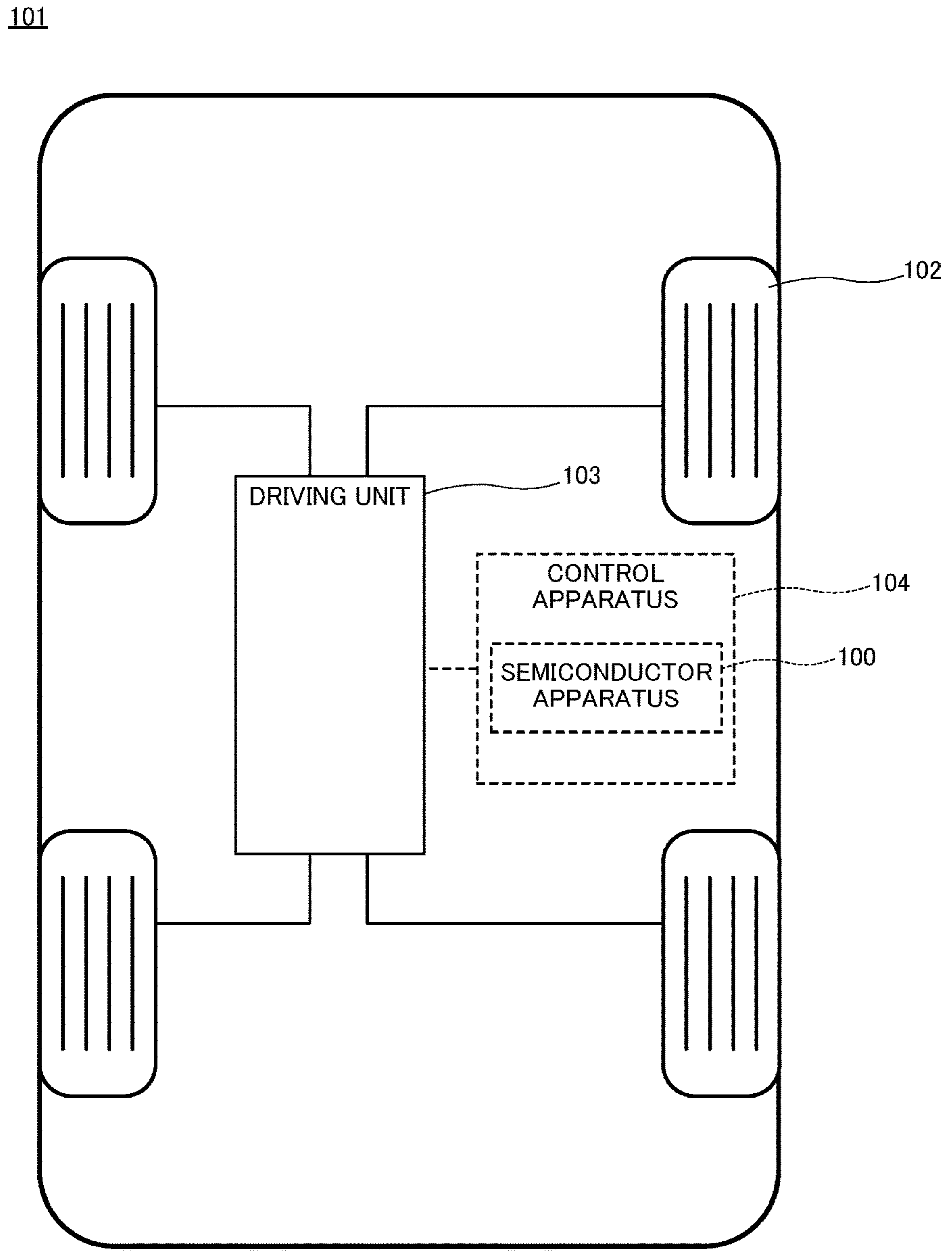
FIG. 17 is a schematic plan view illustrating an example of a vehicle to which the semiconductor apparatus according to the present invention is applied.

A vehicle to which the present invention is applied will be described with reference to FIG. 17. FIG. 17 is a schematic plan view illustrating an example of the vehicle to which the semiconductor apparatus according to the present invention is applied. A vehicle 101 illustrated in FIG. 17 is composed of a four-wheel vehicle including four wheels 102, for example. An example of the vehicle 101 may be an electric vehicle that drives wheels by a motor or the like or a hybrid vehicle using power of an internal combustion engine in addition to a motor.

The vehicle 101 includes a driving unit 103 that applies power to the wheels 102 and a control apparatus 104 that controls the driving unit 103. The driving unit 103 may be composed of at least one of an engine, a motor, and a hybrid of an engine and a motor, for example.

The control apparatus 104 performs control (e.g., electric power control) of the above-described driving unit 103. The control apparatus 104 includes the above-described semiconductor apparatus 100. The semiconductor apparatus 100 may be configured to perform electric power control for the driving unit 103.

In the above-described embodiment, the number of semiconductor devices 6 and an arrangement portion of each of the semiconductor devices 6 are not limited to those in the above-described configuration, but are appropriately changeable.

In the above-described embodiment, the number of wiring boards and a layout of the wiring boards are not limited to those in the above-described configuration, but are appropriately changeable.

Although the laminate substrate 5 and the semiconductor device 6 are components each formed into a rectangular shape or a square shape in a planar view in the above-described embodiment, the present invention is not limited to the shape. The components may be each formed into a polygonal shape other than the above-described shape.

Although the present embodiment and the modifications have been described, the present invention may be an overall or partial combination of the above-described embodiment and modifications as another embodiment.

The present embodiment is not limited to the above-described embodiment and modifications, but various changes, replacements, and modifications may be made without departing from the spirit of the technical idea. Further, if the technical idea can be implemented in another method by advancement of technology or derivative other technology, the technical idea may be implemented using the method. Therefore, the claims cover all implementations that can be included in the scope of the technical idea.

Feature points in the above-described embodiment are summarized below.

A semiconductor apparatus according to the above-described embodiment includes a resin section covering the periphery of a semiconductor device, and a cooler arranged below the semiconductor device, in which the cooler has a top plate attached to a lower surface of the resin section, the resin section has a protrusion protruding downward from a lower surface of its outer peripheral edge, the protrusion includes a first straight section extending in a predetermined direction in a planar view, and a first curved section connected to the first straight section and curved to be convex in a direction away from the first straight section, the top plate includes a notch that can engage with the protrusion, and the resin section and the top plate are bonded to each other with an adhesive interposed therebetween.

In the semiconductor apparatus according to the above-described embodiment, the resin section includes a resin case having a rectangular frame shape that houses the semiconductor device, the protrusion protrudes downward from a bottom surface of a side wall forming a rectangular frame of the resin case, and a bottom surface of the resin case and an upper surface of the top plate are bonded to each other with the adhesive interposed therebetween.

The semiconductor apparatus according to the above-described embodiment, the protrusion has a U shape in a planar view by respectively connecting the paired first straight sections opposing each other to both ends of the first curved section having a circular arc shape.

The semiconductor apparatus according to the above-described embodiment, the notch has a complementary shape forming a predetermined gap with respect to the protrusion in a planar view.

In the semiconductor apparatus according to the above-described embodiment, the notch is formed by connecting a second straight section opposing the first straight section with a predetermined gap therebetween and a second curved section opposing the first curved section with a predetermined gap therebetween.

In the semiconductor apparatus according to the above-described embodiment, the protrusion is provided in a side edge portion of the resin section, and the notch is provided in a side edge portion of the top plate.

In the semiconductor apparatus according to the above-described embodiment, a distal end of the protrusion protrudes more downward than a lower surface of the top plate.

In the semiconductor apparatus according to the above-described embodiment, a distal end of the protrusion is at a higher position than that of a lower surface of the top plate.

In the semiconductor apparatus according to the above-described embodiment, the resin section further has a skirt section extending with a predetermined thickness downward along an outer side surface of its side wall, and the skirt section covers at least a part of an outer side surface of the top plate.

In the semiconductor apparatus according to the above-described embodiment, the skirt section includes a portion connected to the protrusion, a lower end of the skirt section is at a position higher than a lower surface of the top plate, and a distal end of the protrusion protrudes more downward than the lower end of the skirt section.

In the semiconductor apparatus according to the above-described embodiment, a side surface of the cooler is recessed inward in a portion corresponding to the skirt section, and a gap between the skirt section and a side surface of the cooler is larger than a gap between the protrusion and the notch.

In the semiconductor apparatus according to the above-described embodiment, the notch is in an end portion of a portion recessed inward, and a step is on a side surface of the cooler in a portion of the notch.

In the semiconductor apparatus according to the above-described embodiment, the top plate has a rectangular shape in a planar view to correspond to the resin section, the notch is formed on each of paired side surfaces opposing each other in a longitudinal direction of the top plate, and the protrusion is formed in only one side wall in a pair of side walls opposing each other in the longitudinal direction.

In the semiconductor apparatus according to the above-described embodiment, an end portion of the skirt section provided on the other side wall is provided at a position overlapping the notch in a side view.

In the semiconductor apparatus according to the above-described embodiment, the adhesive is interposed in a gap between the skirt section and the cooler.

In the semiconductor apparatus according to the above-described embodiment, a positioning pin that rises upward in a corresponding portion just above the protrusion is provided on an upper surface of the resin section.

In the semiconductor apparatus according to the above-described embodiment, there are provided, on a lower surface of the top plate, a plurality of fins respectively arranged at least corresponding portions just below the semiconductor device, and a peripheral wall section that surrounds an outer periphery of the plurality of fins.

In the semiconductor apparatus according to the above-described embodiment, the cooler further has a bottom plate arranged to oppose a lower portion of the top plate and having the plurality of fins and an end portion of the peripheral wall section bonded on its upper surface, and the bottom plate has second notches having the same shape respectively formed in corresponding portions just below the notches in the top plate.

In the semiconductor apparatus according to the above-described embodiment, a distal end of the protrusion is at a higher position than that of a lower surface of the bottom plate.

A vehicle according to the above-described embodiment includes the above-described semiconductor apparatus.

As described above, the present invention has an effect of enabling a positioning accuracy between a case and a cooler to be improved while preventing metal powder from being generated, and is particularly useful in a semiconductor apparatus for electrical use and a vehicle.

REFERENCE SIGNS LIST

- 1: semiconductor module
- 2: semiconductor unit
- 3: case (resin section, resin case)
- 3*a*: opening section
- 4: sealing resin (resin section)
- 5: laminate substrate
- 6: semiconductor device
- 7: metal wiring board
- 10: cooler
- 10*a*: recess
- 11: top plate
- 11*a*: through hole
- 11*b*: cylindrical section
- 12: bottom plate
- 12*a*: through hole
- 12*b*: inlet port
- 12*c*: discharge port
- 13: fin
- 14: peripheral wall section
- 15: notch, second notch
- 15*a*: straight section (second straight section)
- 15*b*: straight section (second straight section)
- 15*c*: circular arc section (second curved section)
- 30: side wall
- 30*a*: skirt section
- 31: side wall
- 31*a*: stepped section
- 31*b*: skirt section
- 32: partition wall
- 33: recess
- 34: recess
- 35: recess
- 36: pillar section
- 37: positioning pin
- 38: through hole
- 39: protrusion
- 39*a*: straight section (first straight section)
- 39*b*: straight section (first straight section)
- 39*c*: circular arc section (first curved section)
- 39*d*: inclined surface
- 50: insulating plate
- 51: heat dissipation plate
- 52: wiring board
- 60: main electrode
- 61: control electrode
- 70: first bonding section
- 71: second bonding section
- 72: connection section
- 80: P terminal
- 80*a*: nut section
- 80*b*: plate-shaped section
- 80*c*: screw hole
- 81: N terminal
- 81*a*: nut section
- 81*b*: plate-shaped section
- 81*c*: screw hole
- 82: M terminal
- 82*a*: nut section
- 82*b*: plate-shaped section
- 82*c*: screw hole
- 83: control terminal
- 90: metal wiring board
- 91: mold resin (resin section)
- 100: semiconductor apparatus
- 101: vehicle
- 102: wheel
- 103: driving unit
- 104: control apparatus
- B: adhesive
- D1: gap
- D2: gap
- E: step
- W: wiring member

What is claimed is:

1. A semiconductor apparatus, comprising:

a semiconductor module including a semiconductor device and a resin section covering the periphery of the semiconductor device; and a cooler arranged below the semiconductor device, wherein the cooler includes a top plate that is attached to a lower surface of the resin section, the resin section has a protrusion protruding downward from an outer peripheral edge of the lower surface of the resin section, the protrusion includes a first straight section extending in a direction from the outer peripheral edge of the resin section toward an inside of the semiconductor module in a plan view of the semiconductor apparatus, and a first curved section having a curved shape convex inward of the semiconductor module and being connected to the first straight section, the top plate includes a first notch that is engageable with the protrusion, the resin section and the top plate are bonded to each other with an adhesive interposed therebetween, and the first notch penetrates from an upper surface to a lower surface of the top plate, and includes a second straight section extending from an outer side surface of the top plate toward the inside of the semiconductor module in the plan view of the semiconductor apparatus, and a second curved section having a curved shape convex inward of the semiconductor module and being connected to the second straight section.

2. The semiconductor apparatus according to claim 1, wherein the resin section includes a resin case having a side wall forming a rectangular frame in which the semiconductor device is housed, the protrusion protrudes downward from a bottom surface of the side wall of the resin case, the bottom surface forming the lower surface of the resin section, and the bottom surface of the side wall of the resin case and an upper surface of the top plate are bonded to each other with the adhesive interposed therebetween.

3. The semiconductor apparatus according to claim 1, wherein the first curved section has an arc shape, and the first straight section is provided as a pair of first straight sections that are parallel to each other and are respectively connected to both ends of the first curved section so as to form a U shape in the plan view.

4. The semiconductor apparatus according to claim 1, wherein the first notch has a complementary shape to have a predetermined gap with respect to the protrusion in the plan view.

5. The semiconductor apparatus according to claim 3, wherein the second straight section faces one of the first straight sections with a first predetermined gap therebetween, and the second curved section faces the first curved section with a second predetermined gap therebetween.

6. The semiconductor apparatus according to claim 1, wherein the protrusion is provided in a side edge portion of the resin section, and the first notch is provided in a side edge portion of the top plate.

7. The semiconductor apparatus according to claim 1, wherein a distal end of the protrusion is at a position lower than a position of a lower surface of the top plate.

8. The semiconductor apparatus according to claim 1, wherein a distal end of the protrusion is at a position higher than a position of a lower surface of the top plate.

9. The semiconductor apparatus according to claim 1, wherein the resin section further has a skirt section extending with a predetermined thickness downward along an outer side surface of a side wall of the resin section, and the skirt section covers at least a part of an outer side surface of the top plate.

10. The semiconductor apparatus according to claim 9, wherein the skirt section is connected to the protrusion, a lower end of the skirt section is at a position higher than a position of a lower surface of the top plate, and a distal end of the protrusion is at a position lower than a position of the lower end of the skirt section.

11. The semiconductor apparatus according to claim 9, wherein a side surface of the cooler is recessed inward at a portion of the side surface facing the skirt section, the first notch is engaged with the protrusion to have a first gap therebetween, and a second gap between the skirt section and the side surface of the cooler is larger than the first gap.

12. The semiconductor apparatus according to claim 11, wherein the first notch is provided at an inwardly recessed portion of an end portion of the top plate, and a side surface of the cooler has a step at a position where the first notch is provided.

13. The semiconductor apparatus according to claim 9, wherein the top plate has a rectangular shape in the plan view to correspond to a shape of the resin section, the first notch is provided as a pair of first notches that are respectively formed on each of a pair of side surfaces facing each other in a longitudinal direction of the top plate, and the protrusion is formed on only one of a pair of side walls facing each other in the longitudinal direction.

14. The semiconductor apparatus according to claim 13, wherein an end portion of the skirt section provided on the other one of the pair of side walls is provided at a position overlapping one of the first notches in a side view of the semiconductor apparatus.

15. The semiconductor apparatus according to claim 9, wherein the adhesive is interposed in a gap between the skirt section and the cooler.

16. The semiconductor apparatus according to claim 1, further comprising a positioning pin on an upper surface of the resin section, that rises upward at a position directly above the protrusion.

17. The semiconductor apparatus according to claim 1, wherein the top plate includes, on a lower surface thereof, a plurality of fins respectively arranged in at least an area directly below the semiconductor device, and a peripheral wall section that surrounds an outer periphery of the plurality of fins.

18. The semiconductor apparatus according to claim 17, wherein the cooler further includes a bottom plate having an upper surface that faces the lower surface of the top plate, the plurality of fins and an end portion of the peripheral wall section being bonded on the upper surface of the bottom plate, and the bottom plate has a second notch directly below the first notch of the top plate, the second notch having a shape that is the same as a shape of the first notch provided at a position.

19. The semiconductor apparatus according to claim 18, wherein a distal end of the protrusion is at a position higher than a position of a lower surface of the bottom plate.

20. A vehicle comprising the semiconductor apparatus according to claim 1.

* * * * *